United States Patent [19]
Sakata et al.

[11] Patent Number: 5,790,580
[45] Date of Patent: Aug. 4, 1998

[54] SEMICONDUCTOR OPTICAL INTEGRATED DEVICE

[75] Inventors: Yasutaka Sakata; Takahiro Nakamura; Satoshi Ae, all of Tokyo, Japan

[73] Assignee: NEC Corporation, Tokyo, Japan

[21] Appl. No.: 819,198

[22] Filed: Mar. 17, 1997

Related U.S. Application Data

[63] Continuation of Ser. No. 526,680, Sep. 11, 1995, abandoned.

[30] Foreign Application Priority Data

Sep. 16, 1994 [JP] Japan .................................. 6-221600
Apr. 20, 1995 [JP] Japan .................................. 7-094817

[51] Int. Cl.$^6$ .............. H01S 3/19; G02B 6/12; G02B 6/10; H01L 33/00
[52] U.S. Cl. .............. 372/50; 372/45; 385/14; 385/129; 385/130; 385/131; 385/132; 257/94; 257/96; 257/97; 438/31; 438/47
[58] Field of Search .................. 372/45, 50, 96; 257/103, 78, 94, 96, 97; 385/14, 129–132; 438/514, 31, 542, 47; 117/104

[56] References Cited

U.S. PATENT DOCUMENTS

| | | | |
|---|---|---|---|
| 4,904,616 | 2/1990 | Bohling et al. | 437/81 |
| 5,379,720 | 1/1995 | Kuramata et al. | 117/104 |
| 5,459,747 | 10/1995 | Takiguchi et al. | 372/45 |
| 5,524,017 | 6/1996 | Endo | 372/45 |
| 5,574,289 | 11/1996 | Aoki et al. | 385/130 |

FOREIGN PATENT DOCUMENTS 4-100291  4/1992  Japan .

OTHER PUBLICATIONS

"High–Power and High–Speed Semi–Insulating BH Structure Monolithic Electroabsorption Modulator/DFB Laser Light Source." Soda et al., Electronics Letters, vol. 26, No. 1, Jan. 4, 1990, pp. 9 and 10.

"Novel Structure MQW Electroabsorption Modulator/DFB–Laser Integrated Device Fabricated by Selective Area MOCVD Growth," Aoki et al., Electronics Letters, vol. 27, No. 23, Nov. 7, 1991, pp. 2138–2140.

"DFB–LD/Modulator Integrated Light Source by Bandgap Energy Controlled Selective MOVPE," Kato et al., Electronics Letters, vol. 28, No. 2, Jan. 16, 1992, pp. 153 and 154.

*Primary Examiner*—Rodney B. Bovernick
*Assistant Examiner*—Quyen Phan Leung
*Attorney, Agent, or Firm*—Sughrue, Mion, Zinn, Macpeak & Seas, PLLC

[57] ABSTRACT

The invention provides a semiconductor optical integrated device which includes (a) a semiconductor layer, (b) a plurality of masks formed on the semiconductor layer, each of the masks having a shape varying in an axial direction of a light waveguide, and (c) quantum well structure selectively grown on the semiconductor layer by metal organic vapor phase epitaxy (MOVPE). The quantum well structure includes a well layer having a thickness and a bandgap wherein at least one of the thickness and bandgap in a region is different from those in another regions, a shape of said masks in the region being different from that in the another regions. The invention provides many advantages, one of which is that light waveguides having different bandgaps from one another can be formed on a common plane by single selective growth. This makes it possible to communicate regions to one another with high optical coupling ratio.

39 Claims, 18 Drawing Sheets

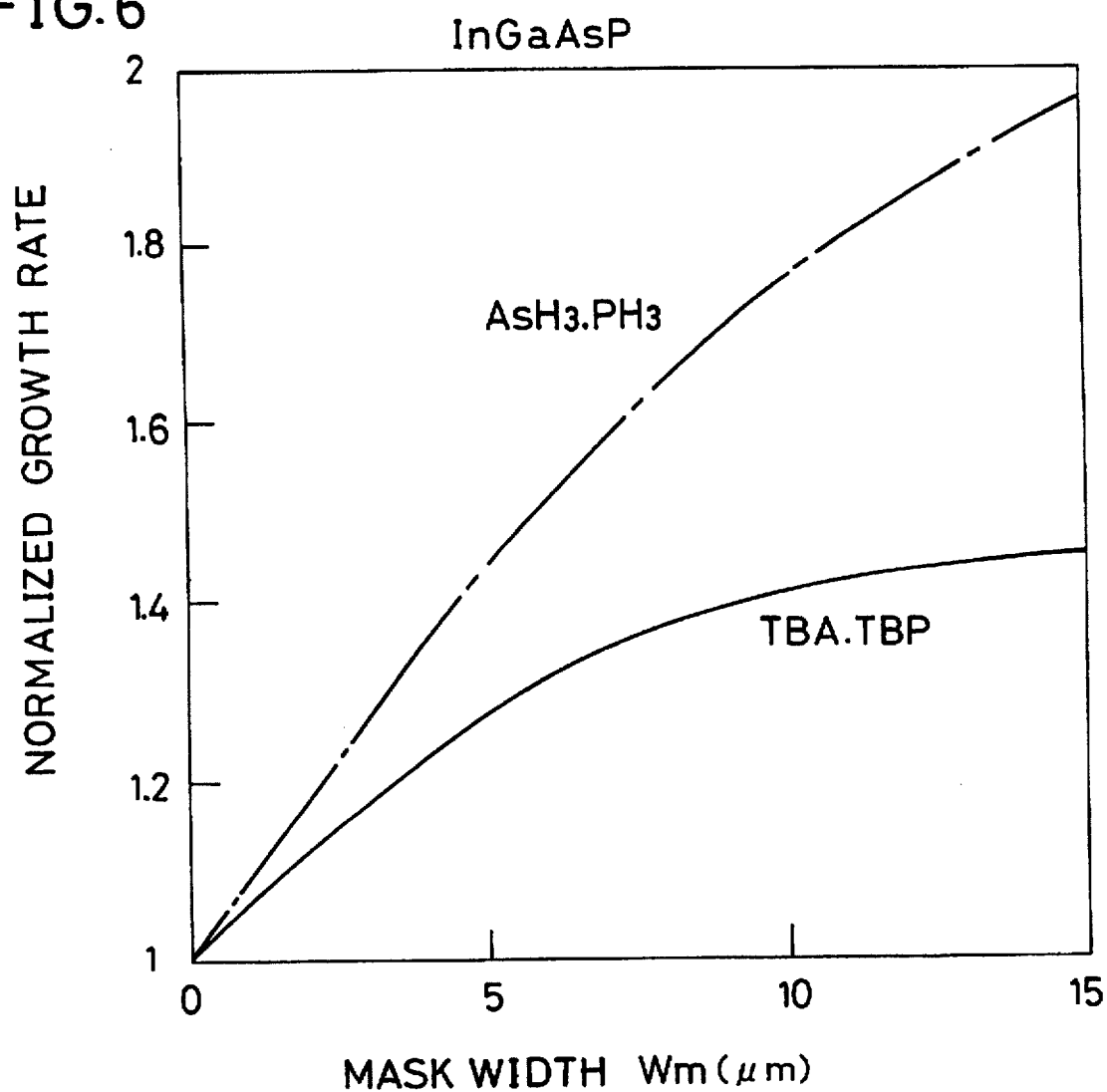

SEMICONDUCTOR OPTICAL INTEGRATED DEVICE

This is a Continuation of application Ser. No. 08/526,680 filed Sep. 11, 1995 now abandoned.

BACKGROUND OF THE INVENTION

1. Field of the Invention

The invention relates to a semiconductor optical integrated device including a plurality of optical semiconductor components such as a laser diode (LD) integrated on a common substrate.

2. Description of the Related Art

An optical semiconductor element such as a semiconductor laser, a semiconductor optical modulator, a semiconductor optical switch and a semiconductor light waveguide is presently studied and researched for application thereof to optical fiber communication system, optical measurement and optical switching. These days, attention has been attracted to a monolithic integrated semiconductor optical integrated device as a device which will make it possible to scale down dimension thereof and decrease fabrication costs, and further which will remarkably enhance an optical coupling efficiency among elements to thereby decrease electric power consumption.

However, monolithic integration of optical semiconductor elements having different functions and uses makes it necessary to form regions, each of which has different bandgap energy, on the same semiconductor substrate, because each of the optical semiconductor elements has different operation wavelength or bandgap energy from one another. Hereinbelow will be explained a conventional monolithic-integrated optical semiconductor device and a method of fabricating the same.

FIG. 1 illustrates a cross-section of an optical semiconductor device in which a distributed feedback laser (DFB-laser) and an electroabsorption type optical modulator are integrated. This device is one reported in an article: HIGH-POWER AND HMGH-SPEED SEMI-INSULATING BH STRUCTURE MONOLITHIC ELECTROABSORPTION MODULATOR/DFB LASER LIGHT SOURCE, by H. Soda et al. in Electronics Letters, Vol. 26, No. 1, pp 9-10, 4th Jan. 1990.

A method of fabricating the optical semiconductor device illustrated in FIG. 1 is as follows. First, on an n-InP substrate 201 is formed diffraction grating 202 in laser region. Then, entirely over the substrate 201 are crystal-grown a laser-side layered structure including an optical guide layer 203, an etching stopper layer 212, and a laser active layer 204 in this order.

Then, the laser active layer 204 is selectively etched to remove only a region in which a modulator is to be formed, and subsequently there is formed an optical absorbing layer 205 by regrowth which cooperates with the laser active layer 204 to form a butt-joint structure. Then, entirely over the laser active layer 204 and the optical absorbing layer 205 are grown a p-InP clad layer 206 and a cap layer 207. Then, a part of the cap layer 207 is removed to expose a part of the clad layer 206, and subsequently the exposed part of the clad layer 206 is covered with an insulating film 211. Finally, there are formed a A side electrode 209 on the thus deposited epitaxial layers and an n-side electrode 210 below the substrate 201.

The above mentioned structure of an optical semiconductor device ensures a relatively high optical coupling efficiency, specifically 80% or greater, between the laser and the modulator. However, since a process of fabricating the optical semiconductor device needs complicated selective etching and selective regrowth, it is difficult to put the process under sufficient control and thereby it is also difficult to repeat fabrication of sufficiently controlled structure of the optical semiconductor device.

To resolve such a problem, there has been suggested a method of fabricating an integrated type optical semiconductor device, which method does no longer need selective etching and regrowth and is capable of forming light waveguides in two regions by single epitaxial growth through the use of metal organic vapor phase epitaxy (MOVPE). Such a method has been reported in an article "NOVEL STRUCTURE MQW ELECTROABSORPTION MODULATOR/DFB-LASER INTEGRATED DEVICE FABRICATED BY SELECTIVE AREA MOCVD GROWTH" by M. Aoki et al. in Electronics Letters, Vol. 27, No. 23, pp 2138-2140, 7th Nov. 1991, and also in Japanese Unexamined Patent Public Disclosure No. 4-100291.

FIGS. 2A to 2C illustrate each step of the method suggested in the above mentioned publications. In the method, as illustrated in FIG. 2A, only in a laser region of an n-InP substrate 301 are formed a pair of $SiO_2$ masks 302 which are to obstruct growth mentioned below. Each of the $SiO_2$ masks 302 has a width of tens to hundreds of micrometers, and the $SiO_2$ masks 302 are spaced away from each other by tens of micrometers. Then, as illustrated in FIG. 2B, there are successively grown an optical guide layer 303, an active layer 304, a clad layer 366, and a cap layer 307 in this order by MOVPE. Then, as illustrated in FIG. 2C, both of the laser region and modulator region are mesa-etched by using $SiO_2$ mask 302a as a mask to thereby form a light waveguide having a width ranging from 1.5 to 2.0 μm. Subsequently, there is grown a Fe doped InP layer 313 at both sides of the light waveguide by using the $SiO_2$ masks 302a as a mask, to thereby bury the light waveguide with the Fe doped InP layer 313 which is to work as a highly resistive layer. That is, the method suggested in the above mentioned publications needs a step of etching a semiconductor for forming a light waveguide. Thus, there arises a problem in the method that the fabrication process is required to be under strict control, which causes a fabrication yield to be decreased.

There has been reported another method for forming an optical semiconductor device through the use of DFB-laser/optical modulator integrated light source in an article "DFB-LD/MODULATOR INTEGRATED LIGHT SOURCE BY BANDGAP ENERGY CONTROLLED SELECTIVE MOVPE" by T. Kato et al. in Electronics Letters, Vol. 28, No. 2, pp 153-154, 16th Jan. 1992. In this method, as illustrated in FIG. 3A, masks for growth obstruction are formed in both DFB laser region I and modulator region II. Namely, a pair of $SiO_2$ masks 402 commonly exist in both the regions on an n-InP substrate 401. Each of the $SiO_2$ masks 402 has a width Wm varying in a longitudinal direction thereof. More specifically, each of the $SiO_2$ masks 402 has a greater width in the DFB laser region I than a width in the modulator region II. By using the $SiO_2$ masks 402 as a mask, there are deposited an optical guide layer 403, a multi-quantum well (MQW) layer 404, and a p-InP layer 405 in this order on the n-InP substrate 401 between the pair of the $SiO_2$ masks 402, as illustrated in FIG. 3B.

This method has an advantage that bandgap energy of a waveguide can be controlled by varying a width of the $SiO_2$ masks 402 when MOVPE selective growth is to be carried out. Such an advantage of this method ensures an integrated structure of a DFB-laser and an optical modulator only by single selective growth, which structure has an optical coupling efficiency of about 100%. FIG. 3C is a graph showing a relationship between a width Wm of $SiO_2$ masks 402 and bandgap wavelength of an active layer to be formed between the $SiO_2$ masks 402. As shown, by designing the $SiO_2$ mask width Wm to be 10 μm at laser side and 3 μm at modulator side, it is possible to vary the bandgap energy by 58 meV which corresponds to 120 nm in bandgap wavelength.

In addition, in accordance with this method, since a light waveguide is formed directly by MOVPE selective growth, a step for forming a light waveguide by mesa-etching a semiconductor is no longer necessary, and hence a process of fabricating an integrated optical semiconductor device is simplified. Thus, an optical device can be fabricated with sufficient controllability and reproducibility.

The conventional method illustrated in FIG. 1 uses selective etching and buried regrowth in combination in order to form two regions having different bandgap energies. Hence, strict control is required in order to conform wavelengths to each other, which causes a problem of low reproducibility. In addition, since two light waveguide regions are formed by individual epitaxial growth step in the method, the number of fabrication steps are increased with the result of lower fabrication yield.

On the other hand, the method shown in FIGS. 2A to 2C makes it possible to form two regions having different bandgap energy from each other by single epitaxial growth. Thus, the number of fabrication steps can be decreased and further a fabrication yield can be enhanced. However, this method has to carry out mesa-etching for forming a light waveguide in transverse fundamental mode, resulting in that it is difficult to enhance reproducibility of a light waveguide and hence it is also difficult to keep uniformity of final products.

The method shown in FIGS. 3A to 3C can overcome all of the above mentioned problems, because the method shown in FIGS. 3A to 3C uses a selectively grown active layer as a light waveguide. However, it is impossible in this method to obtain a large difference in bandgap energy between the two regions, and thus the method can have a limited range of uses.

The reason why a large difference in bandgap energy between the two regions cannot be obtained in the method shown in FIGS. 3A to 3C is as follows. If mask width is varied, crystal composition is changed due to a difference in decomposition rate of source material species on the mask, resulting in that lattice mismatching occurs. For instance, in general, an MQW active layer has a thickness of about 0.1 μm for 1.55 μm laser diodes, and it is necessary to make lattice mismatching smaller than 0.15% in order that a critical thickness of the MQW active layer is made equal to or greater than 0.1 μm. In accordance with the experiments, if a width of the masks is different by 10 μm, lattice mismatching is over 0.15%. If a mask width difference is fixed at 10 μm, a possible and effective bandgap energy difference is 70 meV. Namely, the method illustrated in FIGS. 3A to 3C could not make a bandgap energy difference between the two regions greater than 70 meV.

Among characteristics of a modulator, extinction characteristic is enhanced as an optical confinement coefficient becomes greater, that is, a film thickness becomes greater. However, in the method shown in FIGS. 3A to 3C, since lattice mismatching occurs during selective growth, crystal quality may be deteriorated. Thus, it is not possible to deposit a film to be thick, and hence it is difficult to improve extinction characteristic.

In addition, in this method, when quantum well structure is to be selectively grown, lattice mismatching occurs in a barrier layer as well as in a well layer. This makes it difficult to theoretically forecast crystalline characteristic. This is a large obstacle for designing a structure of semiconductor elements.

On the other hand, it is desired for an integrated optical semiconductor device to form regions on the same substrate, which regions have a larger difference in bandgap energy therebetween. The reason why a larger difference in bandgap energy is desired is as follows.

A semiconductor laser presently available for optical communication has a wavelength of 1.3 μm band in main. It is expected that in the future there will be increased optical communication at 1.55 μm at which loss in optical fibers is minimized, and as a result, optical communication system using the both wavelengths of 1.3 μm and 1.55 μm will be mainly utilized. Accordingly, terminals for use of optical communication system have to cover both 1.55 μm band and 1.3 μm band.

In order to accomplish wavelength division multiplexing (WDM) communication, it is necessary to introduce light emitted from a plurality of semiconductor lasers emitting light at different wavelengths into a single optical fiber. In order to accomplish such introduction of a plurality of lights into a single optical fiber by means of a monolithic integrated optical semiconductor device, it is necessary to unite a plurality of lasers through a light waveguide, and connect the united laser to an optical fiber. In order to make loss in the light waveguide smallest, it is necessary to arrange bandgap of the light waveguide to have a shorter wavelength than a wavelength at which each laser is emitted. In other words, it is necessary against a laser having an oscillation wavelength of 1.55 μm to simultaneously form a light waveguide having a bandgap wavelength of 1.3 μm or smaller. In terms of energy difference, it is necessary to obtain energy difference equal to or greater than 150 meV.

SUMMARY OF THE INVENTION

In view of the foregoing problems and circumstances, it is an object of the present invention to provide a semiconductor optical integrated device capable of forming on the same semiconductor substrate a plurality of regions having a large difference in bandgap energy thereamong.

The invention provides a semiconductor optical integrated device including (a) a semiconductor layer, (b) a plurality of masks formed on the semiconductor layer, each of the masks having a shape varying in an axial direction of a light waveguide, and (c) quantum well structure selectively grown on the semiconductor layer by metal organic vapor phase epitaxy (MOVPE). The quantum well structure includes a well layer having a thickness and a bandgap, at least one of the thickness and bandgap in a region being different from those in another regions. Herein, "a region" is distinct from "another regions" with respect to a shape of the masks. Specifically, a shape of the masks in "a region" is different from a shape in "another regions".

The invention further provides a semiconductor optical integrated device including (a) a semiconductor layer, (b) a plurality of masks formed on the semiconductor layer, each of the masks having a shape varying in an axial direction of a light waveguide, and (c) quantum well structure selectively grown on the semiconductor layer by metal organic vapor phase epitaxy (MOVPE). The quantum well structure includes a well layer and other layers wherein the well layer is grown using arsine ($AsH_3$) as group V source material, while the other layers are grown using tertiarybutylarsine (TBA) as group V source material.

The well layer may be grown further using phosphine (PH$_3$) or tertiarybutylphosphine (TBP) as group V source material. Similarly, the other layers may be grown further using phosphine (PH$_3$) or tertiarybutylphosphine (TBP) as group V source material.

In the semiconductor optical integrated device in accordance with the invention, tertiarybutylarsine C(BA) and tertiarybutylphosphine (TBP) are preferably selected so that a V/III ratio is at least 10.

The invention still further provides a semiconductor optical integrated device including (a) a semiconductor layer, (b) a plurality of masks formed on the semiconductor layer, each of the masks having a shape varying in an axial direction of a light waveguide, and (c) quantum well structure selectively grown on the semiconductor layer by metal organic vapor phase epitaxy (MOVPE). The quantum well structure includes a well layer and other layers. The well layer is grown using, as group V source material, tertiarybutylarsine (TBA) having a first V/III ratio, and the other layers are grown using, as group V source material, tertiarybutylarsine (TBA) and tertiarybutylphosphine (TBP) having a second V/III ratio. Herein, the first V/III ratio is determined to be smaller than a predetermined value, and the second V/III ratio is determined to be greater than the predetermined value. The predetermined value is preferably 10, and more preferably 5.

The invention yet further provides a semiconductor optical integrated device including (a) a semiconductor layer, (b) a plurality of masks formed on the semiconductor layer, each of the masks having a shape varying in an axial direction of a light waveguide, and (c) quantum well structure selectively grown on the semiconductor layer by metal organic vapor phase epitaxy (MOVPE). The quantum well structure includes a well layer and other layers. The well layer is grown using as group V source material tertiarybutylarsine (TBA) and tertiarybutylphosphine (TBP) having a first V/III ratio, and the other layers are grown using as group V source material tertiarybutylarsine (TBA) and tertiarybutylphosphine (TBP) having a second V/III ratio. Herein, the first V/III ratio is determined to be smaller than a predetermined value, and the second V/III ratio is determined to be greater than the predetermined value. The predetermined value is preferably 10, and more preferably 5.

With reference to FIGS. 4A and 4B, hereinbelow will be explained a structure of the optical semiconductor integrated device in accordance with the invention. FIG. 4B illustrates a cross-sectional structure of a light waveguide in which quantum well structure having bandgap wavelengths of 1.55 μm (region I) and 1.3 μm (region II) are monolithic-integrated by MOVPE selective growth FIG. 4A illustrates a mask used for the MOVPE selective growth. The illustrated mask is designed to have a wider width in region I where bandgap wavelength is 1.55 μm than a width in region II where bandgap wavelength is 1.3 μm.

With reference to FIG. 4B, the semiconductor optical integrated device in accordance with the invention includes a multi-layered structure consisting of InGaAs well layers 10 and InGaAsP barrier layers 11 deposited in turn, and a pair of optical confinement layers 12 between which the multi-layered structure is sandwiched. In comparison of region I with region II, the well layers 10 has a thickness two times thicker in region I than a thickness in region II, and hence has an increment Δε of strain caused by lattice mismatching of +0.4%. On the other hand, the barrier layers 11 and the optical confinement layers 12 have constant thickness in the regions I and II, and hence an increment Δε of strain is zero. Thus, an increment Δd of a total thickness of the device is about 7%.

In a conventional semiconductor optical integrated device, the barrier layers and the optical confinement layers have the same thickness variation and the same strain variation as those of the well layers. That is, if a thickness of the well layers becomes doubled in a region relative to another region, a total thickness of a semiconductor optical device also becomes doubled. Namely, Δd is 100%.

On the other hand, in the semiconductor optical integrated device in accordance with the invention, strain to be caused by lattice mismatching of a barrier layer is zero, and hence bandgap energy of quantum well structure can be theoretically forecasted, which is quite beneficial for arranging elements of a semiconductor optical integrated device. In addition, since lattice mismatching is introduced only into well layers, total strain as viewed in total epitaxial layers can be made small. As a result, it is possible to form multi quantum well structure and quantum well structure having a large thickness. The multi quantum well structure enhances optical confinement factor, and thus extinction ratio in an optical modulator can be enhanced. The quantum well structure having a large thickness makes it possible to increase selective growth mask width relative to a conventional mask, and hence it is possible to increase bandgap energy variation without degradation of crystal quality. In addition, even if there are integrated regions having a large difference in bandgap energy, it is possible to keep a difference in a film thickness among regions to be small. Thus, an optical coupling coefficiency is not deteriorated.

Hereinbelow is explained a principle of the method in accordance with the invention with reference to FIGS. 5A to 5C. FIGS. 5B and 5C show the dependency of bandgap wavelength on a mask width Wm in a case where InGaAs and InGaAsP layers are selectively grown by MOVPE. As illustrated in FIG. 5A, a pair of masks 20 for growth obstruction were formed. Each of the masks 20 had a width Wm, and the masks 20 were spaced away from each other by 2 μm. In a region sandwiched between the masks 20 was selectively grown a multilayered structure by MOVPE, which structure comprising an InP buffer layer 21, an InGaAs or InGaAsP layer 22 and an InP cap layer 23. Then, bandgap wavelength was measured by photoluminescence.

FIG. 5B shows the dependency of the bandgap wavelength of InGaAs on the width Wm of the masks 20. In FIG. 5B, the comparison is made between a case where InGaAs is grown using arsine (AsH$_3$) as group V source material and a case where InGaAs is grown using tertiarybutylarsine (TBA) as group V source material. The bandgap energy variation in the case where TBA was used can be reduced down to about one-third of the bandgap energy variation in the case where AsH$_3$ was used.

FIG. 5C shows the dependency of the bandgap wavelength of InGaAsP on the width Wm of the masks 20. In FIG. 5C, the comparison is made between a case where InGaAsP is grown using arsine (AsH$_3$) and phosphine (PH$_3$) as group V source material and a case where InGaAsP is grown using tertiarybutylarsine (TBA) and tertiarybutylphosphine (TBP) as group V source material. The bandgap energy variation in the case where TBA and TBP were used can be reduced down to about one-third of the bandgap energy variation in the case where AsH$_3$ and PH$_3$ were used.

FIG. 6 shows the dependency of the growth rate of the MOVPE selectively grown InGaAsP layer on the width Wm of the masks 20. The growth rate is normalized by a growth rate on a flat substrate (Wm=0 μm). In FIG. 6, the comparison is also made between a case where InGaAsP is grown using arsine (AsH$_3$) and phosphine (PH$_3$) as group V source material and a case where InGaAsP is grown using tertiarybutylarsine (TBA) and tertiarybutylphosphine (TBP) as group V source material. The dependency of the growth rate on the mask width in the case where TBA and TBP were used can be reduced down to about one-half of the dependency in the case where AsH$_3$ and PH$_3$ were used. This tendency is the same with respect to InGaAs.

As explained above, the experimental results show that the use of TBA and/or TBP as group V source material for MOVPE selective growth of an InGaAs(P) layer reduces the dependency of bandgap wavelength on a mask width Wm, and further reduces the dependency of growth rate on a mask width Wm.

Trimethyl Indium (TMIn) and Triethyl Gallium (TEGa), both of which belong to group III material, are facilitated to be decomposed by catalytic action of arsine (AsH$_3$). The above mentioned experimental results are caused by the fact that TMIn is much more facilitated to be decomposed than TEGa. Namely, the selectively grown InGaAsP has larger In content, and also has larger bandgap wavelength variation for the same mask width Wm when AsH$_3$ is used as group V source material. In addition, the selectively grown InGaAsP has greater growth rate because group III source material is decomposed at higher speed.

This catalytic effect by which group III source material containing In has greater decomposition speed than that of group III source material containing Ga can be obtained in the following combinations as well as a combination of TMIn and TEGa: triethyl Indium (TEIn) and TEGa, TMIn and trimethyl gallium (TMGa), and TEIn and TMGa.

The bandgap wavelength variation in MOVPE selective growth of quantum well structure is caused by bandgap variation of a well layer and thickness variation of a well layer. Accordingly, if the well layers are grown using arsine (AsH$_3$) and layers other than the well layers, such as the barrier layers and optical confinement layers, are grown using TBA, it is possible to remarkably reduce bandgap wavelength variation and layer thickness variation to be introduced into the barrier layers and the optical confinement layers, while the bandgap wavelength variation is kept to be the same as they are.

This also remarkably reduces strain caused by lattice mismatching, and layer thickness variation when viewed in total quantum well structure, while the bandgap wavelength variation of quantum well structure against a mask width is kept not to be changed, which is quite important in MOVPE selective growth of a semiconductor optical integrated device.

Hereinbelow will be explained increase of bandgap wavelength variation. FIG. 7A shows the dependency of bandgap wavelength on a mask width Wm. FIG. 7B shows the dependency of photoluminescence intensity on a mask width Wm both when InGaAs/InGaAsP quantum well structure is selectively grown by MOVPE and FIG. 7C is a cross sectional view of a semiconductor optical integrated device. Line A shows the results in a case where both the well layers and barrier layers are grown by using arsine (AsH$_3$) or phosphine (PH$_3$), while line B shows the results in a case where the well layers are grown by using arsine (AsH$_3$) and the barrier layers are grown by using TBA and TBP. The case indicated with the line A has a slightly greater gradient than the case indicated with the line B with respect to bandgap wavelength variation. However, the photoluminescence intensity of the case indicated with the line A is remarkably reduced in a region where a mask width is over 10 μm. Namely, crystal quality is deteriorated because of increased lattice mismatching. On the other hand, the deterioration of crystal quality cannot be found in the case indicated with the line B. Namely, quality crystal is formed in the range where a mask width is between 0 and 50 μm. As a result, it is understood that the use of growth technique used in the case indicated with the line B makes it possible to increase a mask width up to 50 μm. Thus, the bandgap wavelength can be varied in the range of 1.25 μm to 1.60 μm, namely, by 350 nm which corresponds to 217 meV in energy. The reason why such a difference occurs is that as a mask width is increased, lattice mismatching and layer thickness of the barrier layers are increased in the case indicated with the line A, while not changed in the case indicated with the line B.

Next will be explained increase of thickness of a selectively grown layer. FIG. 8 shows the dependency of effective strain on the number of quantum wells in a case where InGaAs (5 nm)/InGaAsP (10 nm) multi-quantum well (MQW) structure is selectively grown by MOVPE on condition that lattice is matched on a flat substrate. A mask width Wm is 10 μm. Herein, effective strain is defined by the following equation:

Effective Strain=Strain×Thickness of a Layer into which strain is introduced

For instance, a critical thickness which can allow strain of 0.15% is 100 nm. Thus, the effective strain in this case is calculated as 0.15×100=15 [%nm].

Line A shows the results in a case where both the InGaAs well layers and InGaAsP barrier layers are grown by using arsine (AsH$_3$) or phosphine (PH$_3$), while line B shows the results in a case where the well layers are grown by using arsine (AsH$_3$) and the barrier layers are grown by using TBA and TBP. As is obvious, the case indicated with the line A exceeds a critical thickness when the number of the well layers is about 7, while the case indicated with the line B does not exceed a critical thickness unless the number of the well layers does not reach about 22. The reason of this is as mentioned earlier. This ensures that MQW structure having a plurality of periods can be accomplished, and hence optical confinement factor is expected to be increased when an optical modulator is fabricated from such MQW structure with the result of enhancement of extinction characteristic.

Hereinbelow will be explained theoretical forecast of bandgap wavelength. FIG. 9 shows a relationship between bandgap wavelength of quantum well structure and a mask width A broken line indicates theoretically calculated values, while black and white dots indicate experimental values. The dependency of thickness and strain of the InGaAs well layer on a mask width was taken into consideration in theoretical calculation The white dots A show the results of a case where both the well and barrier layers are grown by using arsine (AsH$_3$) or phosphine (PH$_3$), while the black dots B show the results of a case where the well layers are grown by using arsine (AsH$_3$) and the barrier layers are grown by using TBA and TBP. As shown in FIG. 9, the results indicated with the black dots B are quite coincident with the theoretically calculated values indicated with the broken line. This means that bandgap wavelength can be theoretically forecasted. Theoretical forecast of bandgap wavelength is quite important for fabricating a device having a narrow band of operation wavelength, such as an electroabsorption type optical modulator.

FIG. 10 shows a relationship between lateral vapor phase diffusion length Ld of group III source material species such as TMIn and TEGa, and a V/III ratio. A solid line indicates a case where TBA and/or TBP are used as group V source material, while a broken line indicates a case where arsine (AsH$_3$) and/or phosphine (PH$_3$) are used as group V source material. When a V/III ratio is greater than 10, the vapor phase diffusion length Ld is smaller by about 10 μm in the case where TBA and/or TBP are used (solid line) than the case where arsine (AsH$_3$) and/or phosphine (PH$_3$) are used (broken line). On the other hand, when a V/III ratio is about 10, the vapor phase diffusion length Ld of group III species becomes suddenly greater, and when a V/III ratio is smaller than 5, the vapor phase diffusion length Ld is greater in the TBA and/or TBP case (solid line) than the AsH$_3$ and/or PH$_3$ case (broken line). Thus, the vapor phase diffusion length Ld of group III species varies in greater degree for unit variation of a V/III ratio when a V/III ratio is smaller than 10 than when a V/III ratio is greater than 10.

The reason of this is as follows. Since the decomposition temperature of TBA and TBP is sufficiently lower than that of arsine (AsH$_3$) and phosphine (PH$_3$), there exist a large amount of group V radicals such as AsH$_2$ and AsH. These radicals react with group III source material species, and hence molecular weight of the group III species are increased, resulting in that the vapor phase diffusion length of the group III species is decreased. Accordingly, the vapor phase diffusion length can be increased by arranging a V/III ratio to be smaller and decreasing group V radicals. In the case that AsH$_3$ and/or PH$_3$ having a high decomposition temperature are used, crystal cannot be sufficiently grown under a low V/III ratio. Thus, the vapor phase diffusion length Ld of group III species varies in quite smaller degree for unit variation of a V/III ratio relative to the case where TBA and/or TBP are used.

FIG. 11 shows the experimental results about the dependency of growth rate of selectively grown InGaAs on a mask width with a V/III ratio being used as a parameter. Since the vapor phase diffusion length of group III species has a positive correlation with the growth rate of selective growth regions, the growth rate becomes greater as a V/III ratio becomes greater.

Based on the above mentioned experimental results, there was estimated photoluminescence (PL) wavelength shift for a V/III ratio which is to occur when InGaAs/InGaAsP MQW structure is selectively grown by MOVPE using TBA as group V source material from which InGaAs well layers are made. Herein, the PL wavelength shift is standardized by PL wavelength shift which is to occur when a mask width Wm is 4 μm. FIG. 12 shows the estimate in which a mask width is used as a parameter. As is understood from FIG. 12, it is expected to obtain PL wavelength shift by more than 250 nm when a mask width Wm is arranged to be 25 μm and a V/III ratio is arranged to be smaller than 3.

Thus, it is possible to obtain large bandgap variation while making thickness variation of a barrier layer and so on to be small, by using TBA and/or TBP having a small V/III ratio as group V source material from which well layers are to be made and further using TBA and/or TBP having a great V/III ratio as group V source material from which layers other than well layers are to be made in selective growth of MQW layers.

As having been described with reference to FIGS. 4A to 12, the invention provides a semiconductor optical integrated device including MQW structure selectively grown by MOVPE, and further including well layers having bandgap wavelength and layer thickness which varies in regions where a growth obstruction mask has different widths, and layers other than well layers, such as barrier layers and optical confinement layers, having bandgap wavelength and layer thickness which do not vary in dependence on regions. The semiconductor optical integrated device in accordance with the invention provides many advantages as follows.

A. The invention makes it possible to form in a common plane light waveguides which have different bandgap from each other, by single selective growth. Thus, regions can be connected to each other with a high optical coupling coefficiency, and hence integrated optical semiconductor devices can be fabricated with high reproducibility and high production yield.

B. In regions where bandgap wavelength is different from each other, there does not occur lattice mismatching of barrier layers and thickness difference among barrier layers. Thus, multi-layered MQW structure can be formed without degradation of crystal quality. For instance, in a case where the invention is applied to an optical modulator, it is possible to enhance performance thereof.

C. Since crystal quality is not degraded even in a region in which a mask width is arranged to be large, there can be obtained a large difference in bandgap energy in a common plane. Accordingly, an integrated optical semiconductor device can be applied in wider area.

D. The invention makes it possible to theoretically forecast bandgap energy and wavelength of selectively grown MQW structure. Such forecast is beneficial for designing a semiconductor optical integrated device including an element having a narrow band of operation wavelength.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 6 shows a growth characteristic curve for explaining the function of the invention;

DESCRIPTION OF THE PREFERRED EMBODIMENTS

Preferred embodiments in accordance with the present invention will be explained hereinbelow with reference to drawings.

Figure 1:
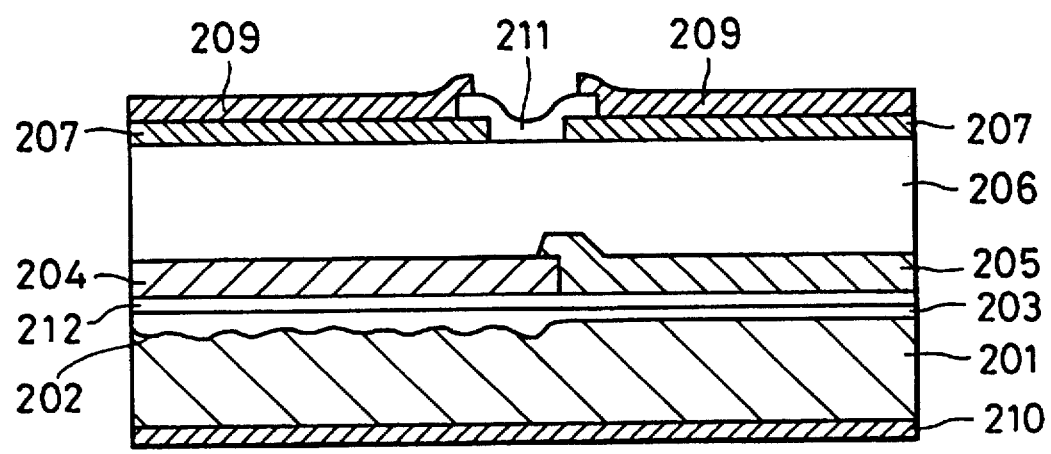
FIG. 1 is a cross-sectional view of a conventional semiconductor optical integrated device.
Figure 2A:
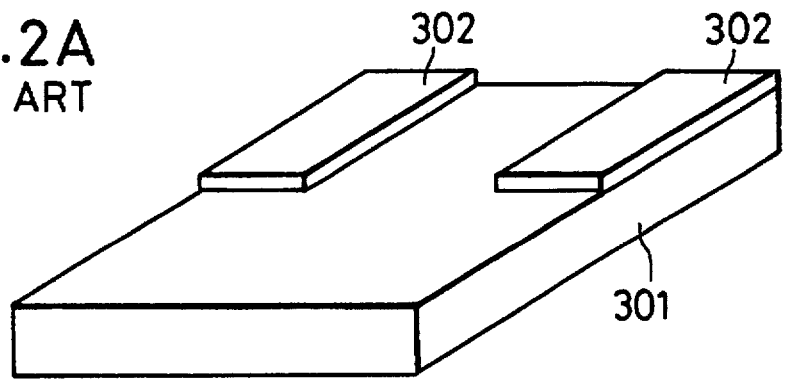
FIGS. 2A and 2B are perspective views showing respective step for fabricating another conventional semiconductor optical integrated device.
Figure 2B:
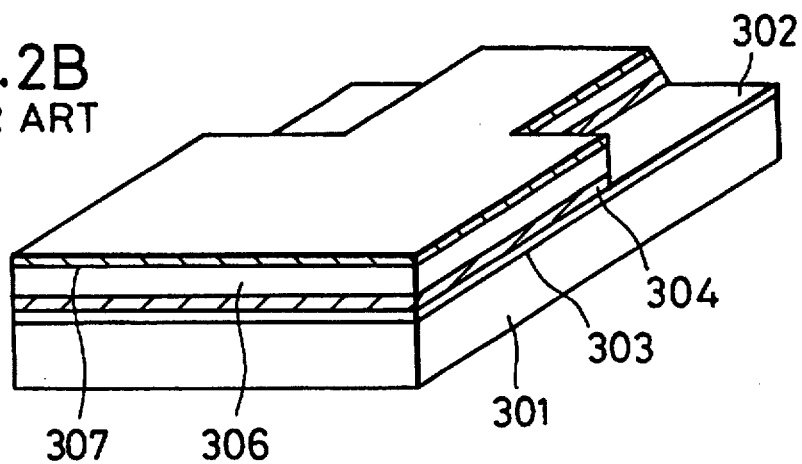
Figure 2C:
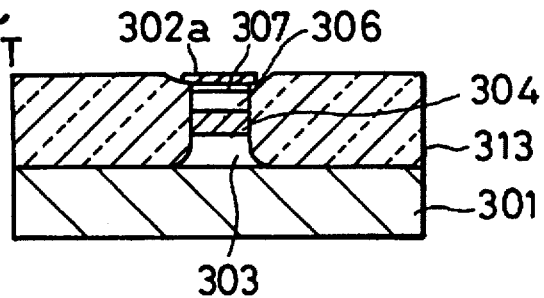
FIG. 2C is a cross-sectional view of the same device.
Figure 3A:
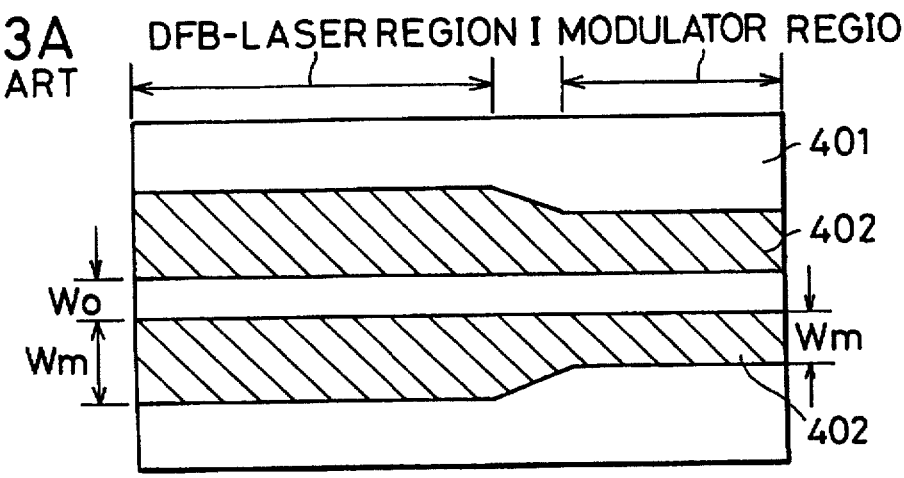
FIG. 3A is a plan view illustrating a mask pattern to be used for still another conventional semiconductor optical integrated device.
Figure 3B:
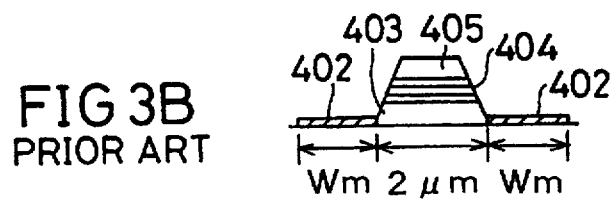
FIG. 3B is a cross-sectional view of the device.
Figure 3C:
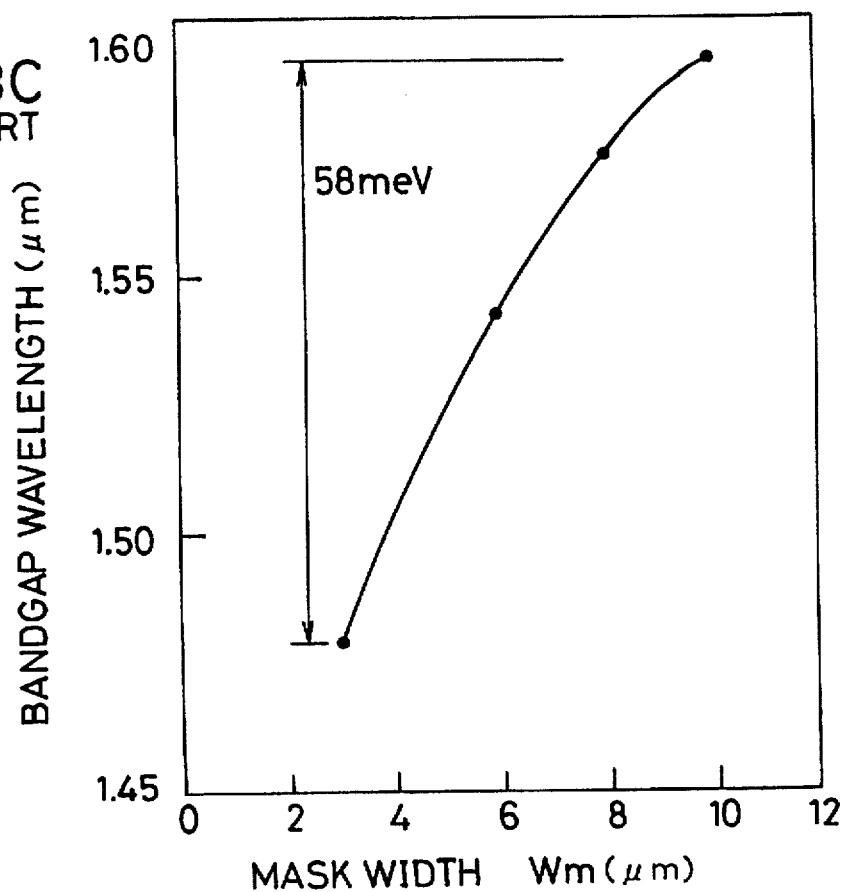
FIG. 3C is a graph of a characteristic curve of the device.
Figure 4A:
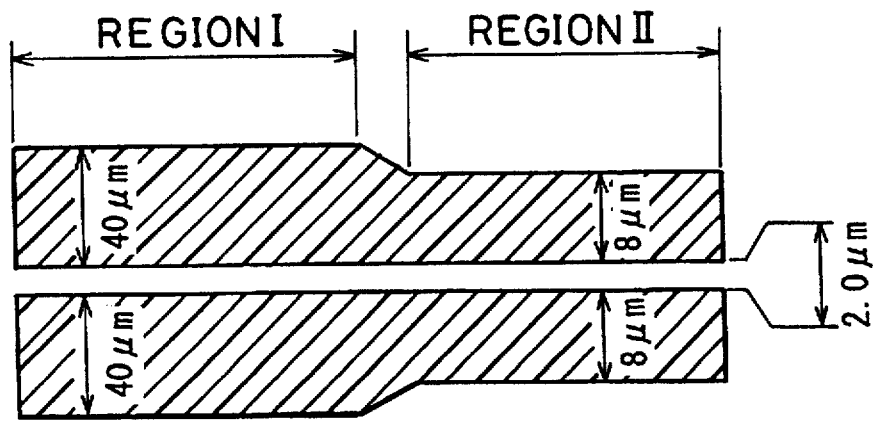
FIG. 4A is a plan view illustrating a mask pattern to be used in the invention.
Figure 4B:
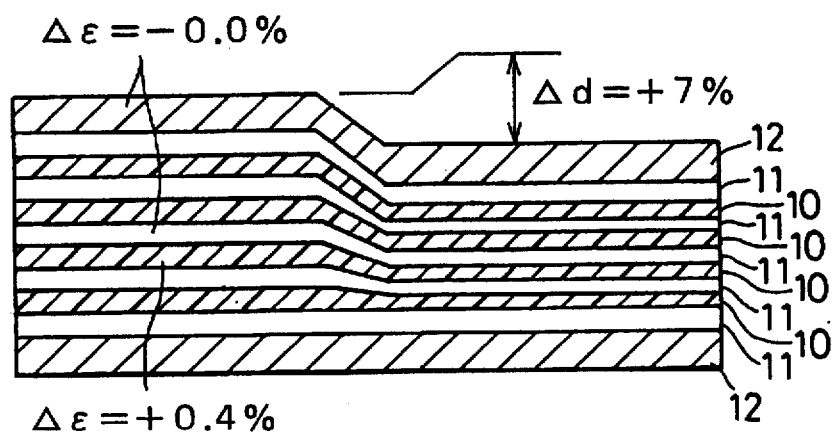
FIG. 4B is a cross-sectional view of a semiconductor optical integrated device in accordance with the invention.
Figure 5A:
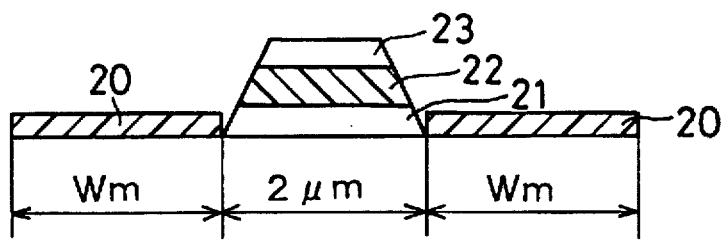
FIG. 5A is a cross-sectional view of a mask pattern to be used in the invention.
Figure 5B:
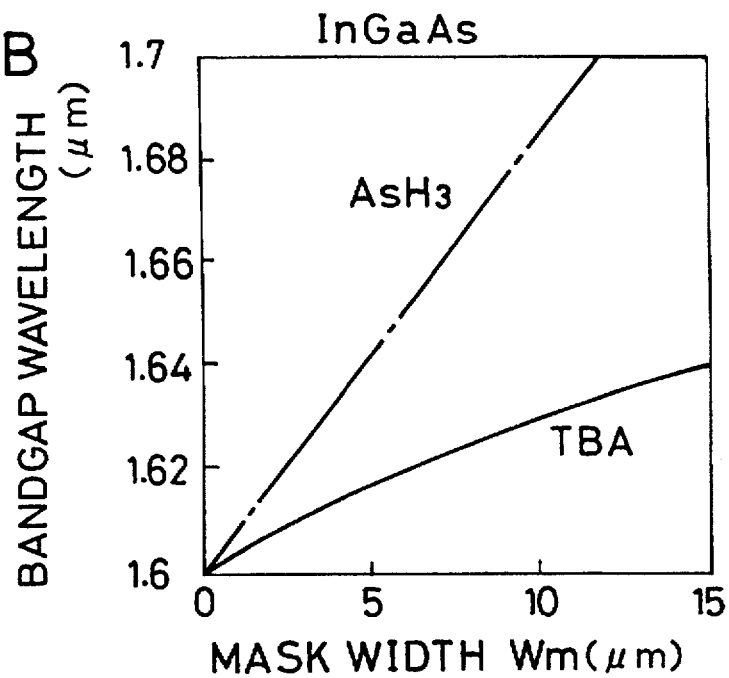
FIGS. 5B and 5C are graphs of growth characteristics curves.
Figure 5C:
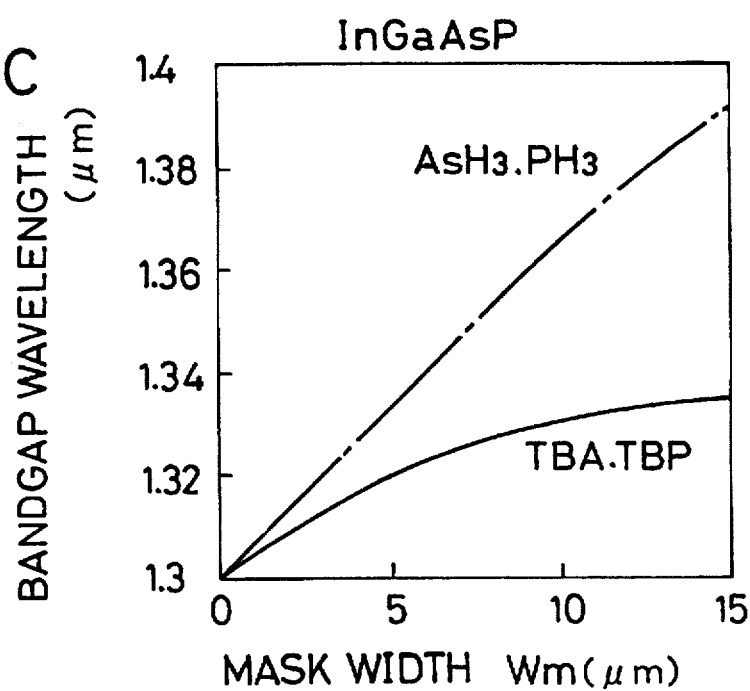
Figure 7A:
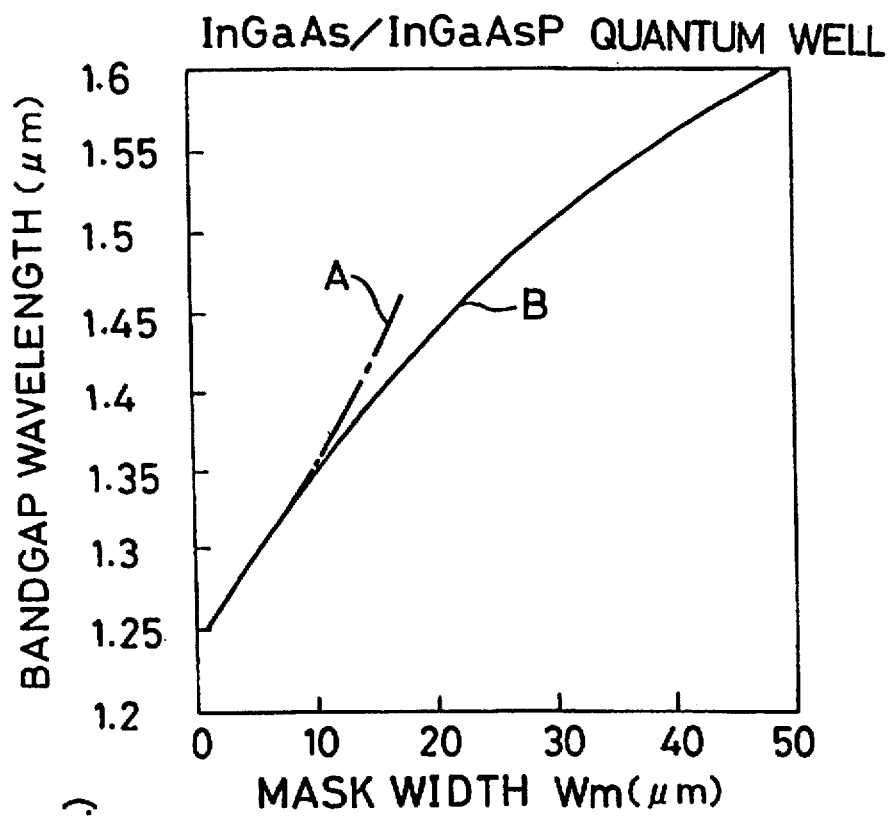
FIGS. 7A and 7B show growth characteristic curves for explaining the function of the invention.
Figure 7B:
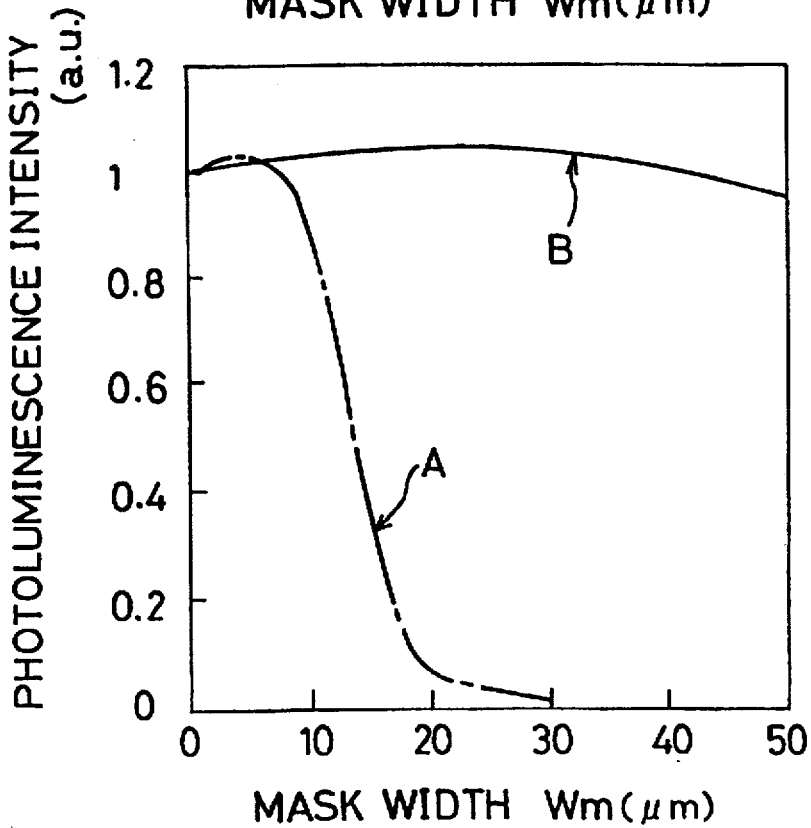
Figure 7C:
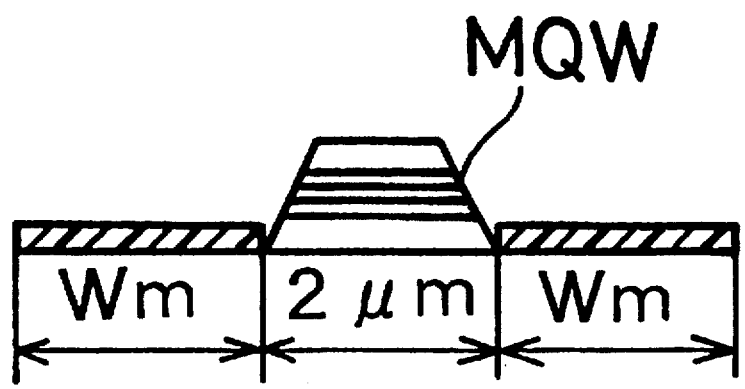
FIG. 7C is a cross sectional view of a semi-conductor optical integrated device.
Figure 8:
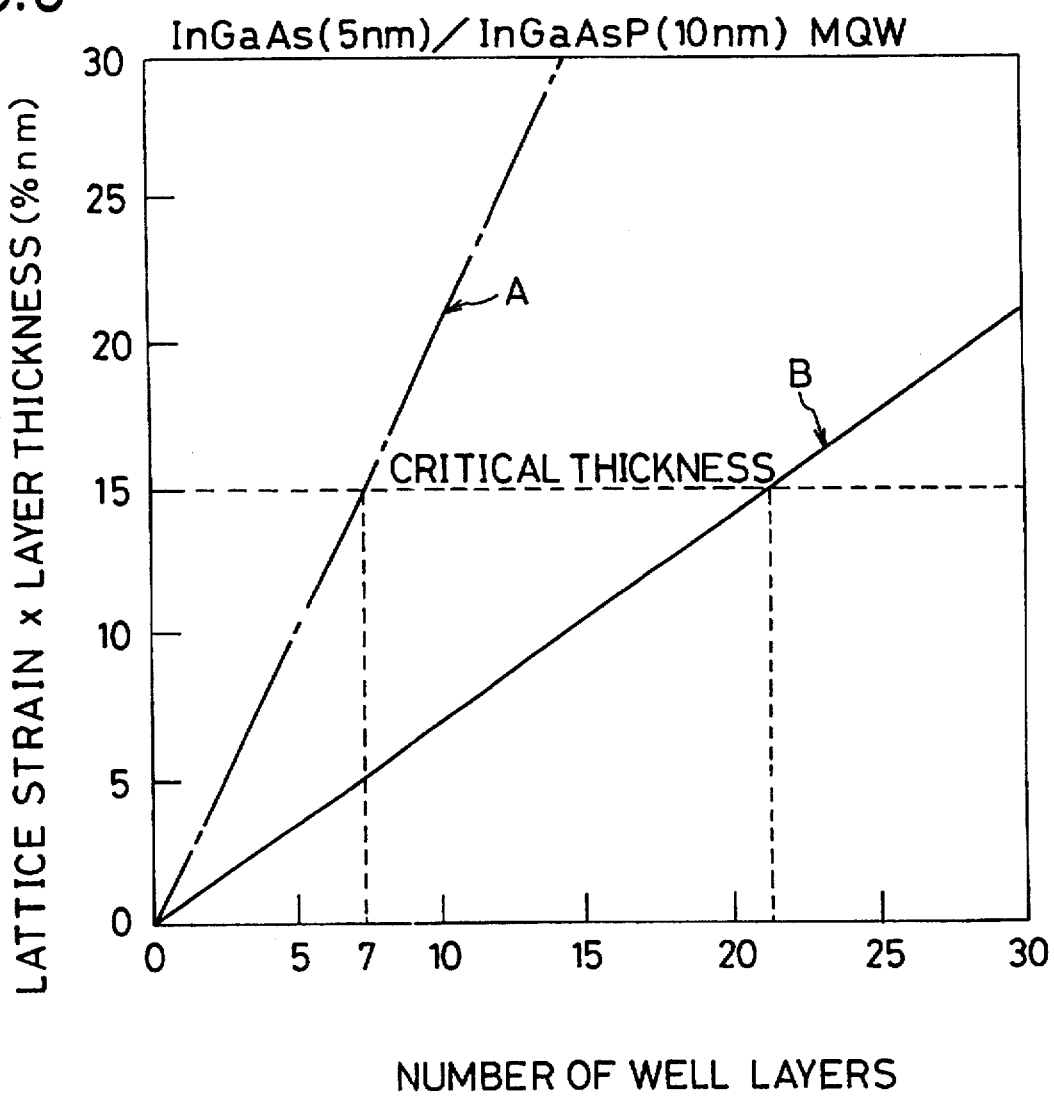
FIG. 8 shows a characteristic curve for explaining the function of the invention.
Figure 9:
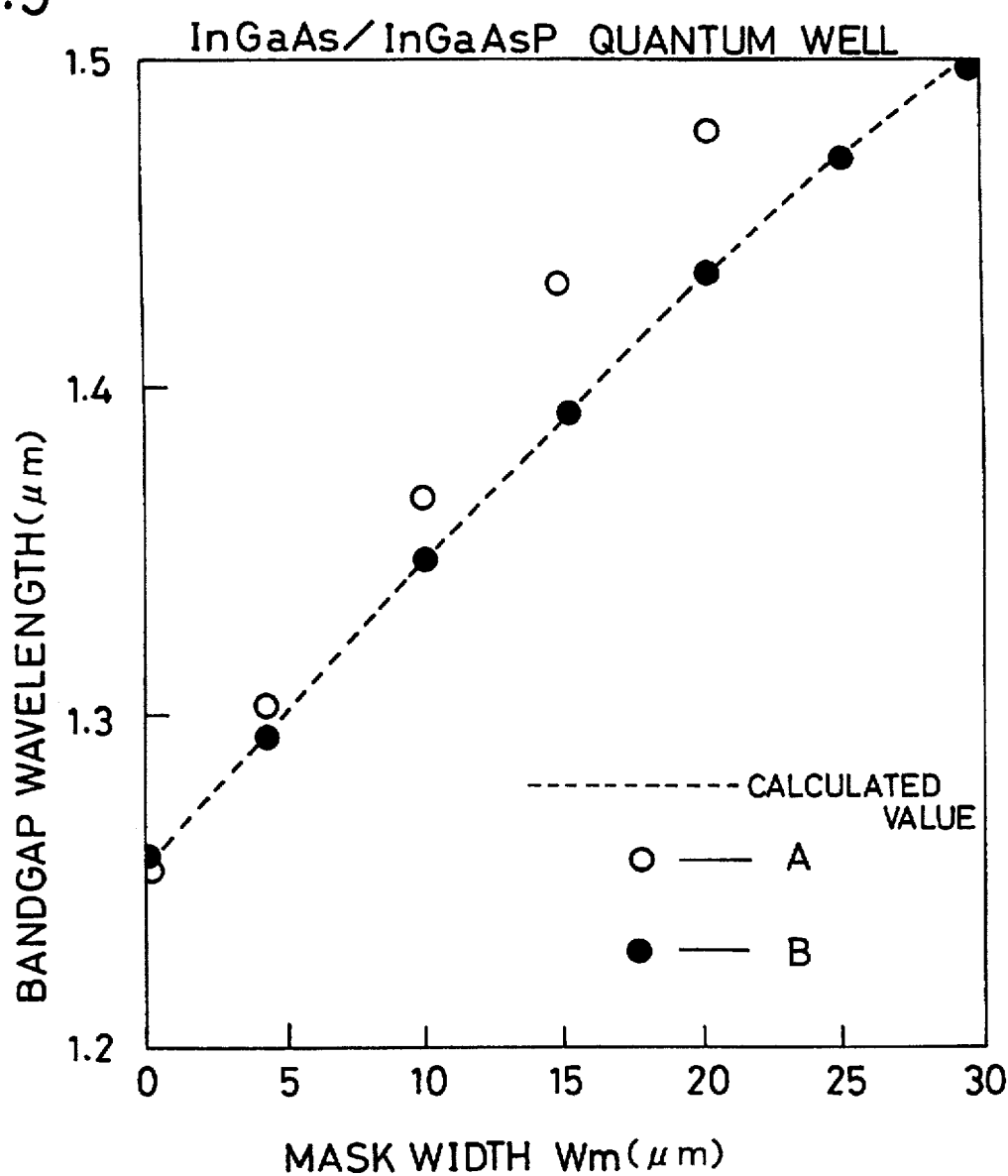
FIG. 9 shows a growth characteristic curve for explaining the function of the invention.
Figure 10:
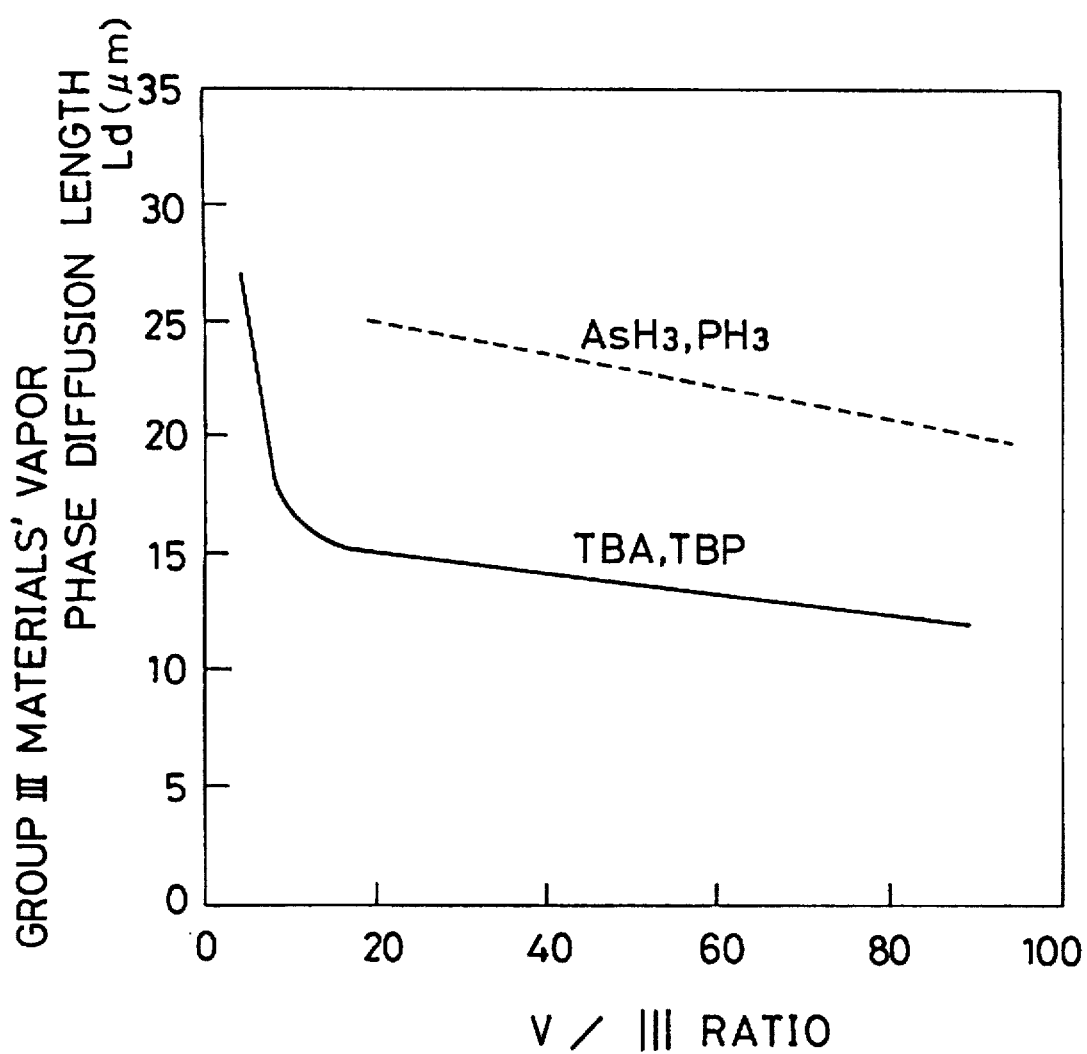
FIG. 10 shows a growth characteristic curve for explaining the function of the invention.
Figure 11:
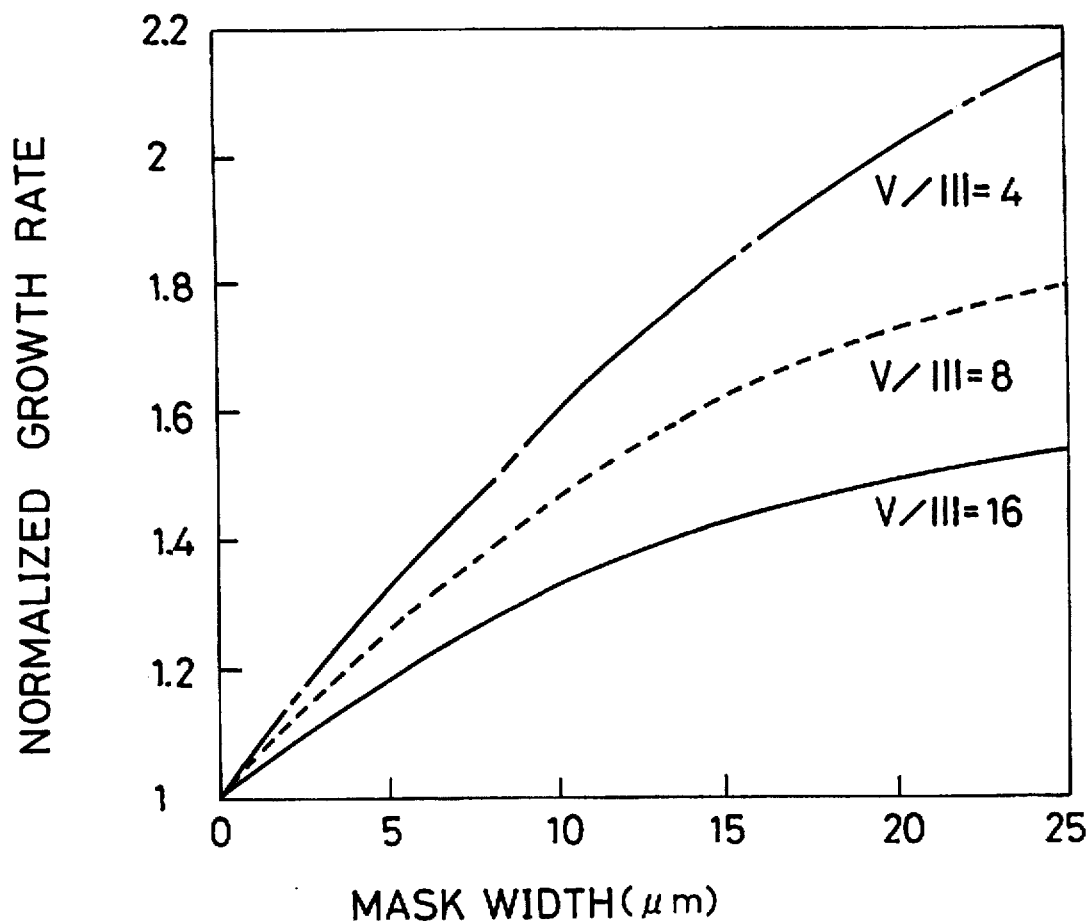
FIG. 11 shows a growth characteristic curve for explaining the function of the invention.
Figure 12:
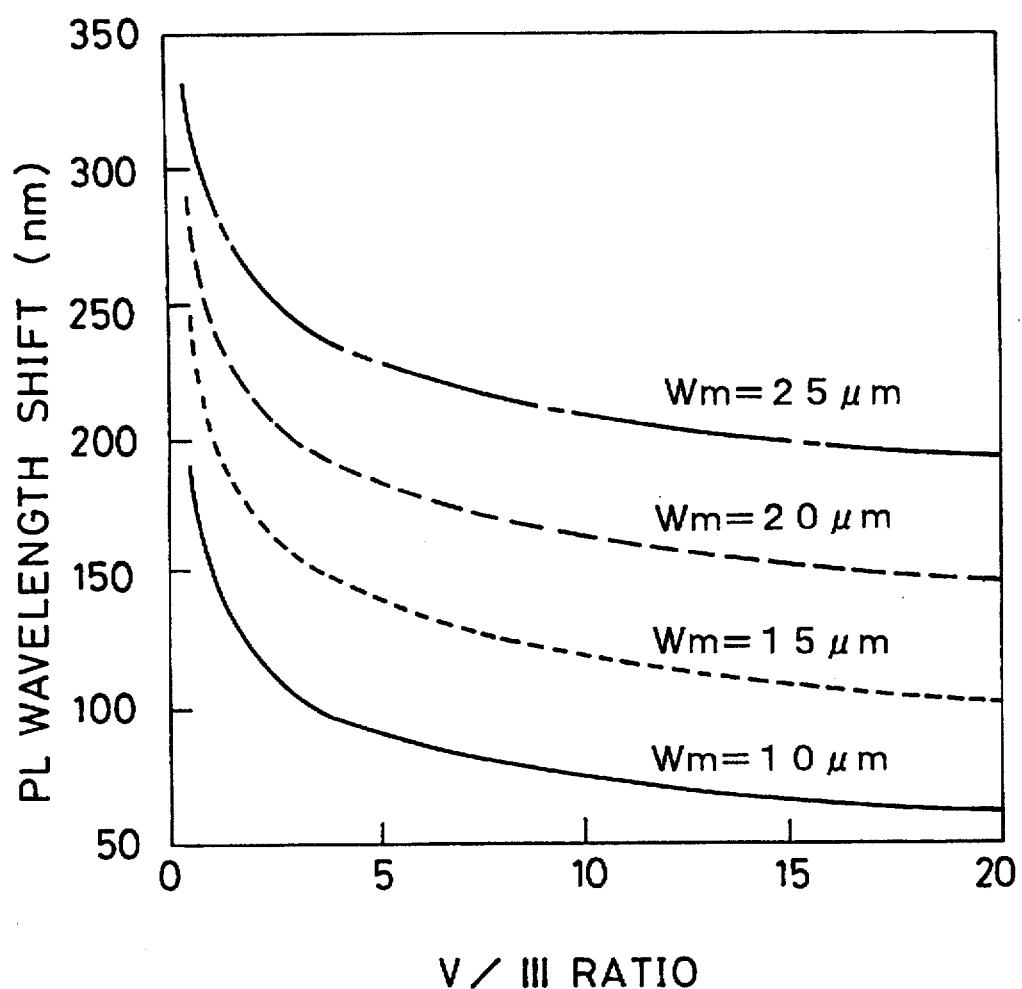
FIG. 12 shows a growth characteristic curve for explaining the function of the invention.
Figure 13A:
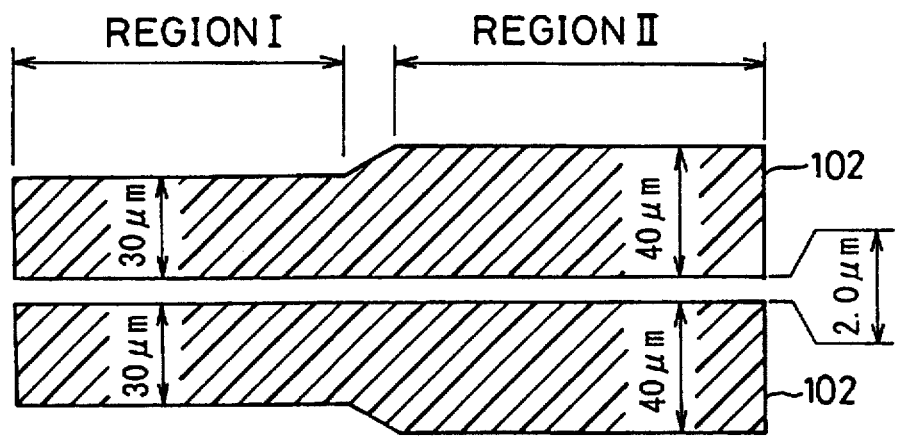
FIG. 13A is a plan view illustrating a mask pattern to be used in the first embodiment in accordance with the invention.
Figure 13B:
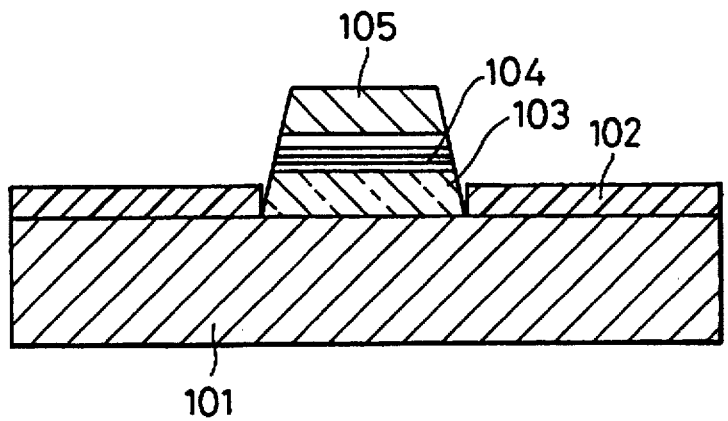
FIGS. 13B and 13C are cross-sectional views of a semiconductor optical integrated device in accordance with the first embodiment in respective step.
Figure 13C:
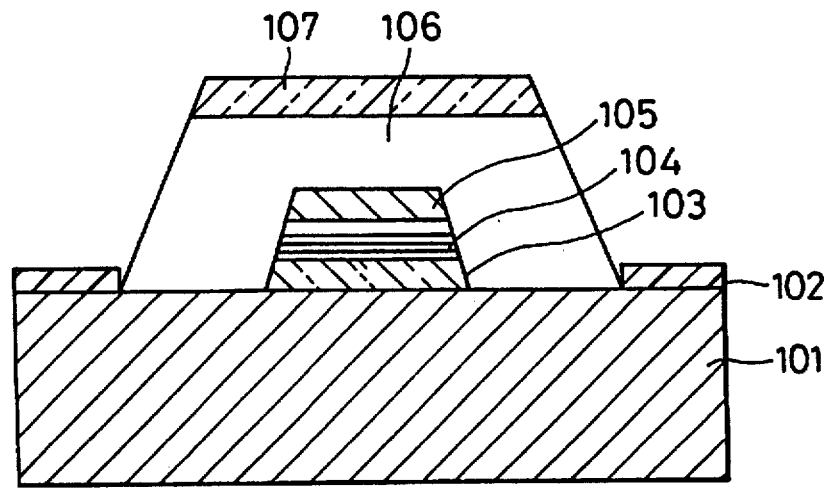
Figure 14:
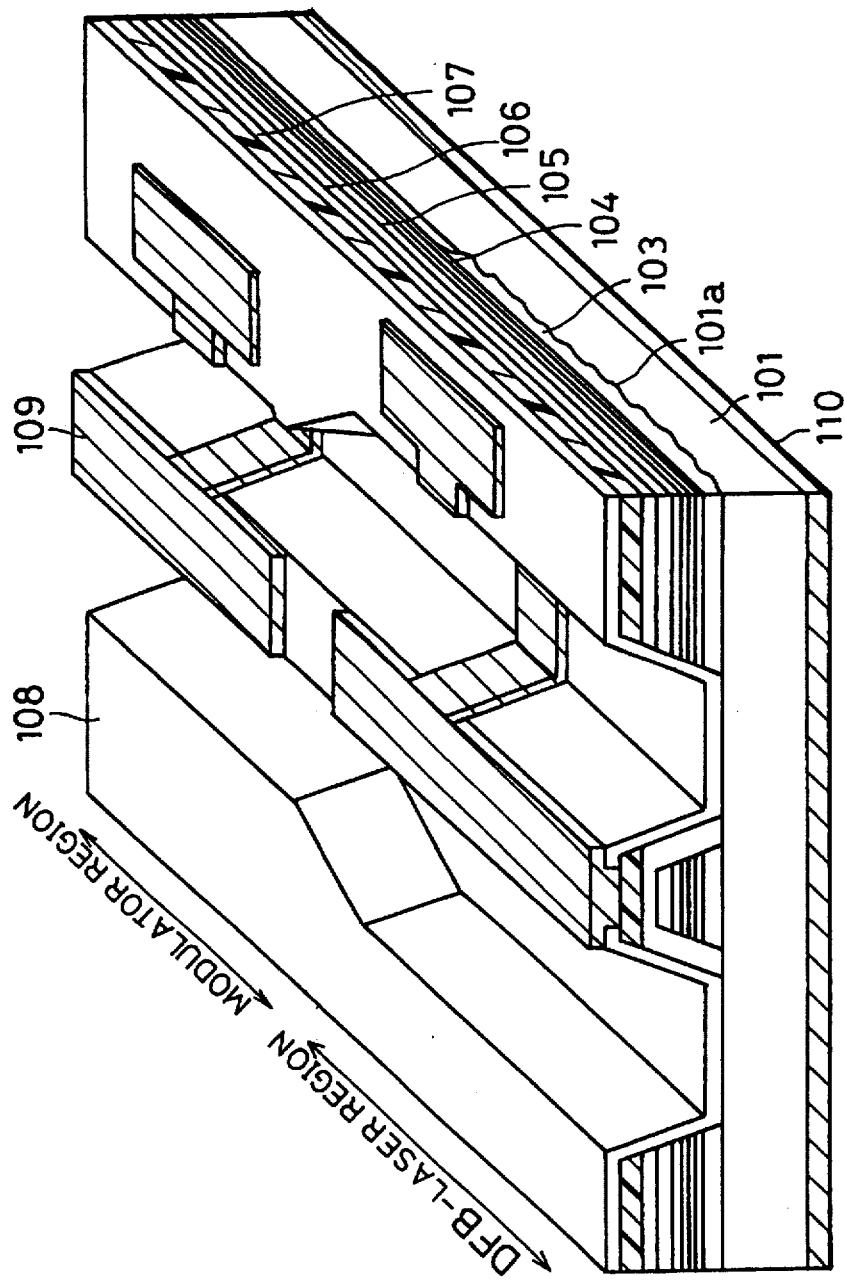
FIG. 14 is a perspective view illustrating a semiconductor optical integrated device in accordance with the first embodiment of the invention.

A first embodiment in accordance with the invention will be explained hereinbelow with reference to FIGS. 13A to 13C and 14 in which FIG. 13A illustrates a mask pattern, FIGS. 13B and 13C are cross-sectional views illustrating respective steps in a process of fabricating a semiconductor optical integrated device in accordance with the first embodiment, and FIG. 14 is a perspective view of a DFB-laser/optical modulator integrated light source in accordance with the first embodiment.

As illustrated in FIG. 13B, $SiO_2$ is deposited on an n-InP substrate 101 by chemical vapor deposition (CVD). Then, the deposited $SiO_2$ is patterned so that stripes are directed in [011] orientation of the n-InP substrate 101. Thus, a pair of $SiO_2$ masks 102 are formed. As illustrated in FIG. 13A, the $SiO_2$ masks 102 are spaced away from each other by 2 μm, and each of the $SiO_2$ masks 102 has a varying width. Namely the width of the $SiO_2$ masks 102 is arranged to be 30 μm in region I, and 40 μm in region II. Prior to deposition of the $SiO_2$ layer, diffraction grating 101a (see FIG. 14) is formed on the n-InP substrate 101 only in the region II.

As illustrated in FIG. 13B, there are selectively grown an optical guide layer 103, a 15 periods multi-quantum well (MQW) active layer 104, and a REP layer 105 in this order by MOVPE on the n-InP substrate 101 on which the $SiO_2$ masks 102 are patterned. The optical guide layer 103 consists of InGaAsP of a 0.1 μm thickness and a 1.2 μm wavelength-composition. Each period of the MQW active layer 104 consists of an InGaAs well layer and a 1.15 μm wavelength-composition InGaAsP barrier layer. The p-InP layer 105 has a thickness of 0.1 μm. The InGaAs well layers are grown by using arsine ($AsH_3$) as group V materials, while other layers are grown by using TBA and TBP.

Then, as illustrated in FIG. 13C, a part of the $SiO_2$ masks 102 is removed to thereby enlarge a spacing between the $SiO_2$ masks 102 to 6 μm. Then, a p-InP clad layer 106 having a thickness of 1.5 μm is selectively grown over the layers 103, 104 and 105, and a p-InGaAs cap layer 107 is also selectively grown by 0.2 μm thickness on the p-InP clad layer 106. In the step illustrated in FIG. 13C, the $SiO_2$ masks 102 may be all removed, and the p-InP clad layer 106 and the p-InGaAs cap layer 107 may be grown all over the substrate 101 and the layers 103, 104 and 105.

Bandgap wavelength of the thus selectively grown layers was measured by micro-area-photoluminescence. The wavelength was 1.49 μm in the region I, and 1.55 μm in the region II. It was also found by observation with scanning electron microscope (SEM) that a thickness difference in the MQW active layer between the regions I and II was smaller than 0.05 μm.

After the step as shown in FIG. 13C has been completed, the $SiO_2$ masks 102 are all removed, and then an $SiO_2$ layer 108 are newly deposited all over a resultant. A part of the $SiO_2$ layer 108 is removed above the p-InGaAs cap layer 107 to thereby expose a part of the cap layer 107. Then, a Ti—Au electrode 109 is formed over the $SiO_2$ layer 108 so as to make a contact with the cap layer 107. A Ti—Au electrode 110 is also formed at a bottom surface of the substrate 101. Thus, a DFB-laser/optical modulator integrated light source as illustrated in FIG. 14 is completed. Although not illustrated, a high reflection film having a reflectivity of 80% is coated onto an end surface of the light source at laser side, and a low reflection film having a reflectivity of 0.1% is coated onto an end surface of the light source at modulator side. Element length is 500 μm in DFB-laser region, 200 μm in modulator region, and 50 μm in isolation region. According to the characterization of this device, an laser-oscillation threshold value was 15 mA, and maximum output with single longitudinal mode oscillation being maintained was 25 mW. An extinction ratio obtained when reverse bias of 2V is applied to the modulator was 25 dB.

Figure 15:
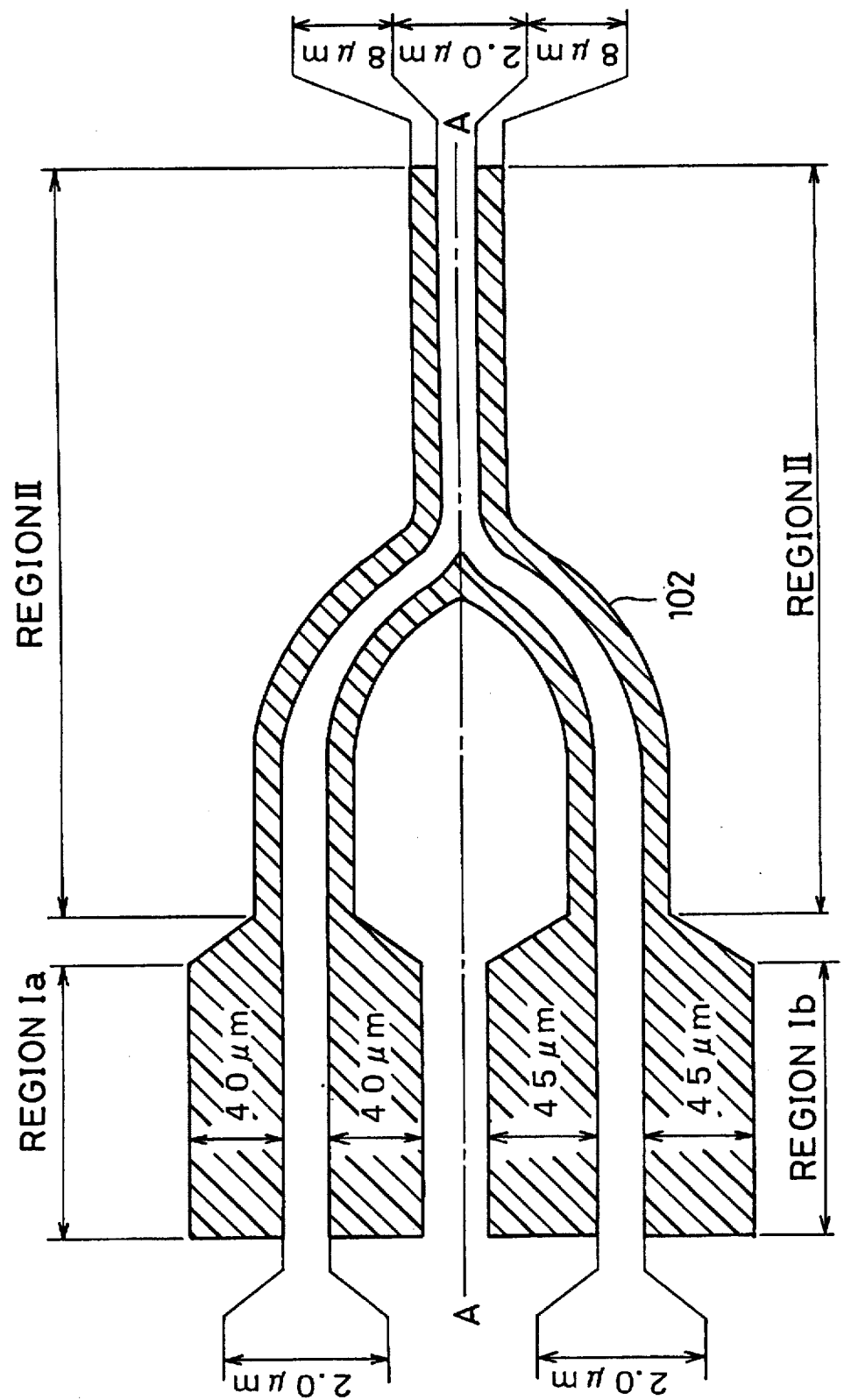
FIG. 15 is a plan view illustrating a mask pattern to be used in the second embodiment in accordance with the invention.
Figure 16:
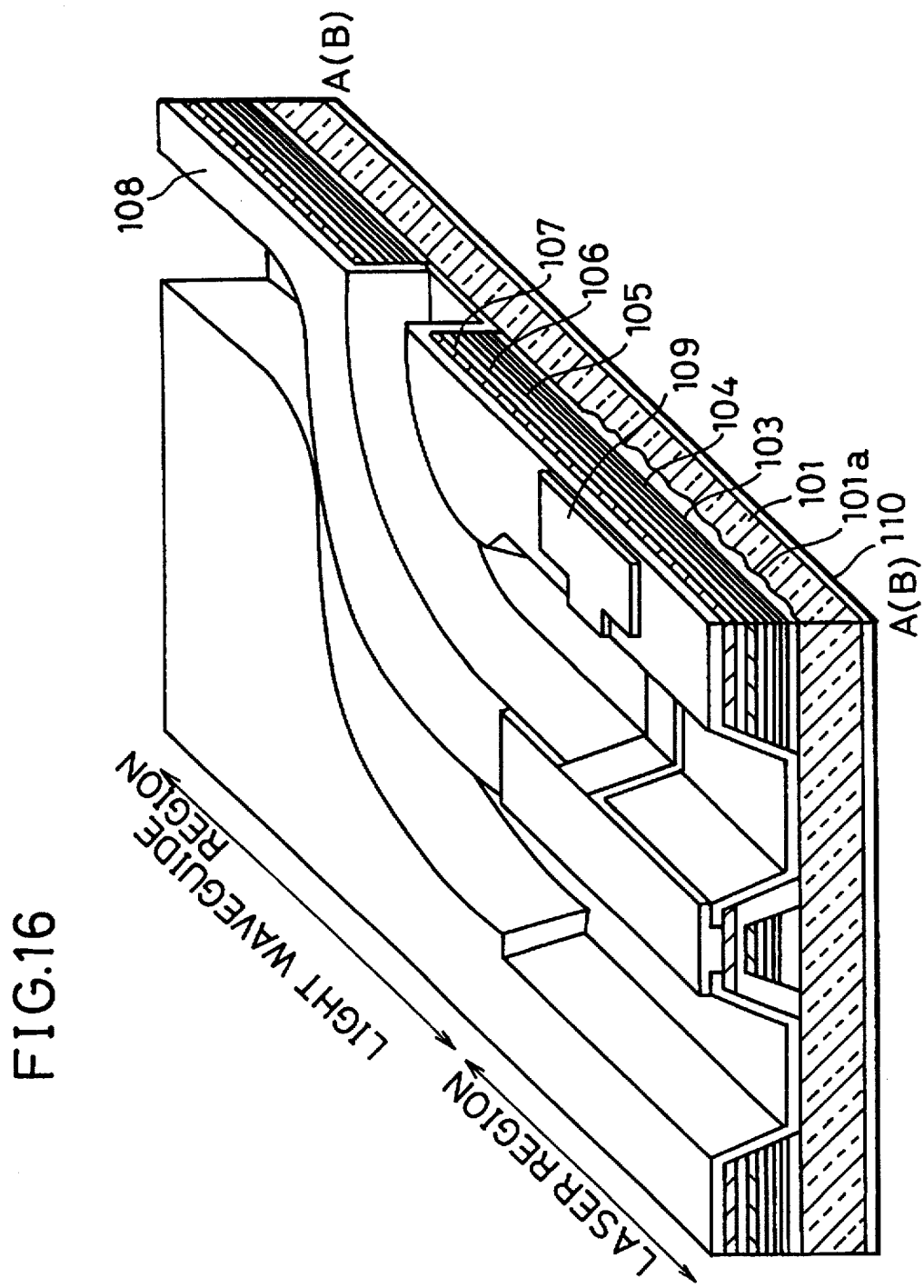
FIG. 16 is a perspective view, partially including a cross-sectional view, of a semiconductor optical integrated device in accordance with the second embodiment of the invention.

Hereinbelow will be explained the second embodiment in accordance with the invention with reference to FIGS. 15 and 16 in which FIG. 15 illustrates a mask pattern to be used for growth obstruction, and FIG. 16 is a perspective view of a semiconductor laser/optical waveguide integrated wavelength division multiplexing (WDM) light source in accordance with the second embodiment. FIG. 16 partially includes a cross-sectional view taken along the line A—A in FIG. 15. In FIGS. 15 and 16, parts or elements that correspond to those of the first embodiment illustrated in FIGS. 13A to 13C and 14 have been provided with the same reference numerals.

First, diffraction grating 101a (see FIG. 16) are formed in laser regions Ia and Ib (see FIG. 15) on the n-InP substrate 101. Then, $SiO_2$ is deposited on the n-InP substrate 101 by chemical vapor deposition (CVD). Then, as illustrated in FIG. 15, the deposited $SiO_2$ is patterned so that stripes are directed in [011] orientation of the n-InP substrate 101. Thus, the $SiO_2$ masks 102 are formed. As illustrated in FIG. 15, each of the pair of the $SiO_2$ masks 102 are spaced away from each other by 2.0 μm, and each of the $SiO_2$ masks 102 has a varying width Namely the width of the $SiO_2$ masks 102 is arranged to be 40 μm in the region Ia, 45 μm in the region Ib, and 8 μm in the region II.

Then, as illustrated in FIG. 16, there are selectively grown the optical guide layer 103, the 7 periods multi-quantum well (MQW) active layer 104, and the p-InP layer 105 in this order by MOVPE on the n-InP substrate 101 on which the $SiO_2$ masks 102 are patterned. The optical guide layer 103 consists of InGaAsP of a 0.1 μm thickness and a 1.2 μm wavelength-composition. Each period of the MQW active layer 104 consists of an InGaAs well layer and a 1.15 μm wavelength-composition InGaAsP barrier layer. The p-InP layer 105 has a thickness of 0.1 μm.

Then, a part of the SiO₂ masks 102 is removed to thereby enlarge a spacing between the SiO₂ masks 102. Then, the p-InP clad layer 106 having a thickness of 1.5 μm is selectively grown over the layers 103, 104 and 105, and the p-InGaAs cap layer 107 is also selectively grown by 0.2 μm thickness on the p-InP clad layer 106. The InGaAs well layers are grown by using arsine (AsH₃) as group V materials, while other layers are grown by using TBA and TBP.

Bandgap wavelength of the thus selectively grown layers was measured by micro-area-photoluminescence. The wavelength was 1.55 μm in the region Ia, 1.57 μm in the region Ib, and 1.30 μm in the region II. It was also found by observation with scanning electron microscope (SEM) that a thickness difference in the MQW active layer between the regions Ia, Ib and II was smaller than 0.05 μm.

The SiO₂ masks 102 are all removed, and then the SiO₂ layer 108 are newly deposited all over a resultant. A part of the SiO₂ layer 108 is removed above the p-InGaAs cap layer 107 to thereby expose a part of the cap layer 107. Then, the Ti—Au electrode 109 is formed over the SiO₂ layer 108 so as to make a contact with the cap layer 107. The Ti—Au electrode 110 is also formed at a bottom surface of the substrate 101. Thus, a semiconductor laser/light waveguide WDM integrated light source as illustrated in FIG. 16 is completed.

Element length is 300 μm in the laser region, and 1000 μm in the light waveguide region. Although not illustrated, a high reflection film having a reflectivity of 80% is coated onto an end surface of the light source at laser side, and a low reflection film having a reflectivity of 0.1% is coated onto an end surface of the light source at light waveguide side. According to the characterization of this device, an laser-oscillation threshold value was 10 mA in both of the regions Ia and Ib, and optical output transmitted from the light waveguide side when an operation current was 100 mA was 20 mW. An oscillation wavelength was 1.552 μm in the region Ia, and 1.557 μm in the region Ib.

Figure 17:
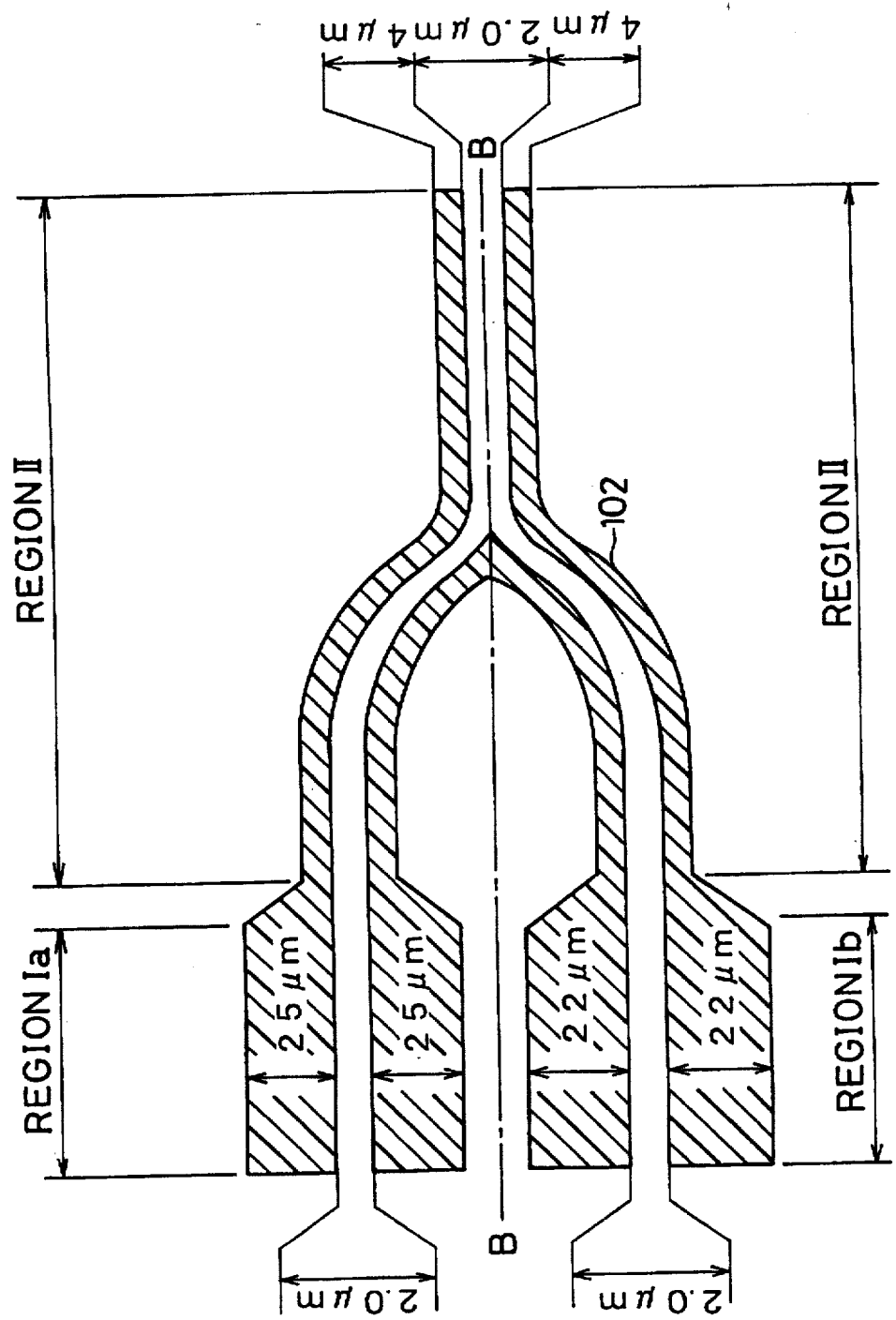
FIG. 17 is a plan view illustrating a mask pattern to be used in the third embodiment in accordance with the invention.

Hereinbelow will be explained the third embodiment in accordance with the invention with reference to FIGS. 17 and 16 in which FIG. 17 illustrates a mask pattern to be used for growth obstruction, and FIG. 16 is a perspective view of a semiconductor laser/optical waveguide integrated wavelength division multiplexing (WDM) light source in accordance with the third embodiment (FIG. 16 is also used for explaining the third embodiment, because the light source in accordance with the third embodiment has analogous structure to that of the second embodiment). FIG. 16 partially includes a cross-sectional view taken along the line B—B in FIG. 17. In FIGS. 16 and 17, parts or elements that correspond to those of the first embodiment illustrated in FIGS. 13A to 13C and 14 have been provided with the same reference numerals.

First, the diffraction grating 101a are formed in the laser regions Ia and Ib on the n-InP substrate 101. Then, SiO₂ is deposited on the n-InP substrate 101 by chemical vapor deposition (CVD). Then, as illustrated in FIG. 17, the SiO₂ masks 102 are formed so that stripes of the SiO₂ masks are directed in [011] orientation of the n-InP substrate 101. As illustrated in FIG. 17, each of the pair of the SiO₂ masks 102 are spaced away from each other by 2.0 μm, and each of the SiO₂ masks 102 has a varying width. Namely the width of the SiO₂ masks 102 is arranged to be 25 μm in the region Ia, 22 μm in the region Ib, and 4 μm in the region II.

Then, as illustrated in FIG. 16, there are selectively grown the optical guide layer 103, the 7 periods multi-quantum well (MQW) active layer 104, and the p-InP layer 105 in this order by MOVPE on the n-InP substrate 101 on which the SiO₂ masks 102 are patterned. The optical guide layer 103 consists of InGaAsP of a 0.1 μm thickness and a 1.2 μm wavelength-composition. Each period of the MQW active layer 104 consists of an InGaAs active layer and a 1.13 μm wavelength-composition InGaAsP barrier layer. The p-InP layer 105 has a thickness of 0.1 μm.

Then, a part of the SiO₂ masks 102 is removed to thereby enlarge a spacing between the SiO₂ masks 102. Then, the p-InP clad layer 106 having a thickness of 1.5 μm is selectively grown over the layers 103, 104 and 105, and the p-InGaAs cap layer 107 is also selectively grown by 0.2 μm thickness on the p-InP clad layer 106. The InGaAs well layers are grown by using TBA having a V/III ratio of 3 as group V materials, while other layers are grown by using TBA having a V/III ratio greater than 10 as group V materials Bandgap wavelength of the thus selectively grown layers was measured by micro-area-photoluminescence. The wavelength was 1.55 μm in the region Ia, 1.53 μm in the region Ib, and 1.30 μm in the region II. It was also found by observation with scanning electron microscope (SEM) that a thickness difference in the MQW active layer between the regions Ia, Ib and II was smaller than 0.05 μm. Then, similarly to the first and second embodiments, the Ti—Au electrodes 109 and 110 are formed, and thus, a semiconductor laser/light waveguide WDM integrated light source as illustrated in FIG. 16 is completed.

Element length is 300 μm in the laser region, and 1000 μm in the light waveguide region. Although not illustrated, a high reflection film having a reflectivity of 80% is coated onto an end surface of the light source at laser side, and a low reflection film having a reflectivity of 0.1% is coated onto an end surface of the light source at light waveguide side. According to the characterization of this device, an laser-oscillation threshold value was 8 mA in both of the regions Ia and Ib, and optical output transmitted from the light waveguide side when an operation current was 50 mA was 10 mW. An oscillation wavelength was 1.555 μm in the region Ia, and 1.550 μm in the region Ib.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor optical integrated device comprising:
    a semiconductor layer;
    a plurality of masks formed on said semiconductor layer, each of said masks having a shape varying in an axial direction of a light waveguide; and
    quantum well structure selectively grown on said semiconductor layer by metal organic vapor phase epitaxy (MOVPE),
    said quantum well structure including a well layer and other layers, with each of said well layer and said other layers having a thickness and a bandgap, at least one of said thickness and bandgap of said well layer being different in a first region than in a second region, said thickness and bandgap of said other layers being the same in said first region as in said second region, a shape of said masks in said first region being different from that in said second region.

2. A semiconductor optical integrated device comprising:
a semiconductor layer;
a plurality of masks formed on said semiconductor layer, each of said masks having a shape varying in an axial direction of a light waveguide; and
quantum well structure selectively grown on said semiconductor layer by metal organic vapor phase epitaxy (MOVPE),
said quantum well structure including a well layer and other layers each of said well layer and said other layers having a thickness and a bandgap, with at least one of said thickness and bandgap of said well layer being different in a first region than in a second region, said thickness and bandgap of said other layers being the same in said first region as in said second region, a shape of said masks being different in said first region than in said second region,
said well layer being grown using arsine ($AsH_3$) as group V source material, and said other layers being grown using tertiarybutylarsine (TBA) as group V source material.

3. The semiconductor optical integrated device as recited in claim 2, wherein said well layer being grown further using phosphine ($PH_3$) as group V source material.

4. The semiconductor optical integrated device as recited in claim 3, wherein said other layers being grown further using phosphine ($PH_3$) as group V source material.

5. The semiconductor optical integrated device as recited in claim 3, wherein said other layers being grown further using tertiarybutylphosphine (TBP) as group V source material.

6. The semiconductor optical integrated device as recited in claim 5, wherein said tertiarybutylarsine (TBA) and said tertiarybutylphosphine (TBP) are selected so that a V/III ratio is at least 10.

7. The semiconductor optical integrated device as recited in claim 2, wherein said well layer being grown further using tertiarybutylphosphine (TBP) as group V source material.

8. The semiconductor optical integrated device as recited in claim 7, wherein said other layers being grown further using phosphine ($PH_3$) as group V source material.

9. The semiconductor optical integrated device as recited in claim 7, wherein said other layers being grown further using tertiarybutylphosphine (TBP) as group V source material.

10. The semiconductor optical integrated device as recited in claim 2, wherein said other layers being grown further using phosphine ($PH_3$) as group V source material.

11. The semiconductor optical integrated device as recited in claim 2, wherein said other layers being grown further using tertiarybutylphosphine (TBP) as group V source material.

12. The semiconductor optical integrated device as recited in claim 11, wherein said tertiarybutylarsine (TBA) and said tertiarybutylphosphine (TBP) are selected so that a V/III ratio is at least 10.

13. A semiconductor optical integrated device comprising:
a semiconductor layer;
a plurality of masks formed on said semiconductor layer, each of said masks having a shape varying in an axial direction of a light waveguide; and
quantum well structure selectively grown on said semiconductor layer by metal organic vapor phase epitaxy (MOVPE),
said quantum well structure including a well layer and other layers, each of said well layer and said other layers having a thickness and a bandgap, with at least one of said thickness and bandgap of said well layer being different in a first region than in a second region, said thickness and bandgap of said other layers being the same in said first region as in said second region, a shape of said masks being different in said first region than in said second region,
said well layer being grown using, as a group V source material, tertiarybutylarsine (TBA) having a first V/III ratio, and said other layers being grown using as group V source material, tertiarybutylarsine (TBA) and tertiarybutylphosphine (TBP) having a second V/III ratio, said first V/III ratio being smaller than a predetermined value and said second V/III ratio being greater than said predetermined value.

14. The semiconductor optical integrated device as recited in claim 13, wherein said predetermined value is 10.

15. The semiconductor optical integrated device as recited in claim 13, wherein said predetermined value is 5.

16. A semiconductor optical integrated device comprising:
a semiconductor layer;
a plurality of masks formed on said semiconductor layer, each of said masks having a shape varying in an axial direction of a light waveguide; and
quantum well structure selectively grown on said semiconductor layer by metal organic vapor phase epitaxy (MOVPE),
said quantum well structure including a well layer and other layers, each of said well layer and said other layers having a thickness and a bandgap, with at least one of said thickness and bandgap of said well layer being different in a first region than in a second region, said thickness and bandgap of said other layers being the same in said first region as in said second region, a shape of said masks being different in said first region than in said second region,
said well layer being grown using as group V source material, tertiarybutylarsine (TBA) and tertiarybutylphosphine (TBP) having a first V/III ratio, and said other layers being grown using as group V source material tertiarybutylarsine (TBA) and tertiarybutylphosphine (TBP) having a first V/III ratio being smaller than a predetermined value and second V/III ratio being greater than said predetermined value.

17. The semiconductor optical integrated device as recited in claim 16, wherein said predetermined value is 10.

18. The semiconductor optical integrated device as recited in claim 16, wherein said predetermined value is 5.

19. A semiconductor optical integrated device comprising:
a semiconductor layer;
a plurality of masks formed on said semiconductor layer, each of said masks having a shape varying in an axial direction of a light waveguide; and
a quantum well structure selectively grown on said semiconductor layer, said quantum well structure including a well layer and other layers, with each of said well layer and said other layers having a thickness and a bandgap energy, the bandgap energy of a first region of said well layer being different from that of a second region by greater than about 70 meV, said thickness and bandgap of said other layers being the same in said first region as in said second region, and a shape of said masks in said first region being different from that in said second region.

20. The semiconductor optical integrated device as recited in claim 19, wherein the thickness of the well layer in the first region is different from that of a second region.

21. The semiconductor optical integrated device as recited in claim 19, wherein the bandgap energy of the well layer in the first region is different from that of the second region by greater than about 150 meV.

22. A method for fabricating a semiconductor optical integrated device comprising:

providing a semiconductor layer;

forming a plurality of masks on said semiconductor layer while varying a shape of each of said masks in an axial direction of a light waveguide; and selectively growing a well layer and other layers of a quantum well structure on said semiconductor layer by metal organic vapor phase epitaxy (MOVPE), wherein, said step of selectively growing a well layer and other layers of said quantum well structure provides a well structure and other layers each having a thickness and a bandgap; and wherein, said step of selectively growing a well layer and other layers of said quantum well structure further comprises:

varying at least one of said thickness and said bandgap of said well layer from a first region to a second region;

varying relative shapes of said masks in said first region and said second region; and maintaining said thickness and said bandgap of said other layers the same in said first region and said second region.

23. The method for fabricating a semiconductor optical integrated device as recited in claim 22, wherein the step of selectively growing a well layer and other layers of a quantum well structure on said semiconductor layer by metal organic vapor phase epitaxy (MOVPE) further comprises growing said well layer using arsine ($AsH_3$) as group V source material; and growing said other layers using tertiarybutylarsine (TBA) as group V source material.

24. The method for fabricating a semiconductor optical integrated device as recited in claim 23, wherein the step of selectively growing a well layer and other layers of a quantum well structure on said semiconductor layer by metal organic vapor phase epitaxy (MOVPE) further comprises growing said well layer using phosphine ($PH_3$) as group V source material.

25. The method for fabricating a semiconductor optical integrated device as recited in claim 24, wherein the step of selectively growing a well layer and other layers of a quantum well structure on said semiconductor layer by metal organic vapor phase epitaxy (MOVPE) further comprises growing said other layers using phosphine ($PH_3$) as group V source material.

26. The method for fabricating a semiconductor optical integrated device as recited in claim 25, wherein said tertiarybutylarsine (TBA) and said tertiarybutylphosphine (TBP) are selected so that a V/III ratio is at least 10.

27. The method for fabricating a semiconductor optical integrated device as recited in claim 23, wherein the step of selectively growing a well layer and other layers of a quantum well structure on said semiconductor layer by metal organic vapor phase epitaxy (MOVPE) further comprises growing said well layer using tertiarybutylphosphine (TBP) as group V source material.

28. The method for fabricating a semiconductor optical integrated device as recited in claim 27, wherein the step of selectively growing a well layer and other layers of a quantum well structure on said semiconductor layer by metal organic vapor phase epitaxy (MOVPE) further comprises growing said other layers using phosphine ($PH_3$) as group V source material.

29. The method for fabricating a semiconductor optical integrated device as recited in claim 27, wherein the step of selectively growing a well layer and other layers of a quantum well structure on said semiconductor layer by metal organic vapor phase epitaxy (MOVPE) further comprises growing said other layers using tertiarybutylphosphine (TBP) as group V source material.

30. The method for fabricating a semiconductor optical integrated device as recited in claim 23, wherein the step of selectively growing a well layer and other layers of a quantum well structure on said semiconductor layer by metal organic vapor phase epitaxy (MOVPE) further comprises growing said other layers using phosphine ($PH_3$) as group V source material.

31. The method for fabricating a semiconductor optical integrated device as recited in claim 30, wherein the step of selectively growing a well layer and other layers of a quantum well structure on said semiconductor layer by metal organic vapor phase epitaxy (MOVPE) further comprises growing said other layers using tertiarybutylphosphine (TBP) as group V source material.

32. The method for fabricating a semiconductor optical integrated device as recited in claim 23, wherein the step of selectively growing a well layer and other layers of a quantum well structure on said semiconductor layer by metal organic vapor phase epitaxy (MOVPE) further comprises growing said other layers using tertiarybutylphosphine (TBP) as group V source material.

33. The method for fabricating a semiconductor optical integrated device as recited in claim 32, wherein said tertiarybutylarsine (TBA) and said tertiarybutylphosphine (TBP) are selected so that a V/III ratio is at least 10.

34. The method for fabricating a semiconductor optical integrated device as recited in claim 22, wherein the step of selectively growing a well layer and other layers of a quantum well structure on said semiconductor layer by metal organic vapor phase epitaxy (MOVPE) further comprises:

growing said well layer using, as a group V source material, tertiarybutylarsine (TBA) having a first V/III ratio; and growing said other layers using, as group V source material, tertiarybutylarsine (TBA) and tertiarybutylphosphine (TBP) having a second V/III ratio;

wherein, said first V/III ratio is smaller than a predetermined value and said second V/III ratio is greater than said predetermined value.

35. The method for fabricating a semiconductor optical integrated device as recited in claim 34, wherein said predetermined value is 10.

36. The method for fabricating a semiconductor optical integrated device as recited in claim 34, wherein said predetermined value is 5.

37. The method for fabricating a semiconductor optical integrated device as recited in claim 22, wherein the step of selectively growing a well layer and other layers of a quantum well structure on said semiconductor layer by metal organic vapor phase epitaxy (MOVPE) further comprises:

growing said well layer using, as group V source material, tertiarybutylarsine (TBA) and tertiarybutylphosphine (TBP) having a first V/III ratio; and growing said other layers using, as group V source material, tertiarybutylarsine (TBA) and tertiarybutylphosphine (TBP) having a second V/III ratio;

wherein, said first V/III ratio is smaller than a predetermined value and second V/III ratio is greater than said predetermined value.

38. The method for fabricating a semiconductor optical integrated device as recited in claim 37, wherein said predetermined value is 10.

39. The method for fabricating a semiconductor optical integrated device as recited in claim 37, wherein said predetermined value is 5.

* * * * *